United States Patent
Luo

(10) Patent No.: US 12,009,803 B2
(45) Date of Patent: Jun. 11, 2024

(54) BULK ACOUSTIC WAVE RESONATOR, FILTER AND RADIO FREQUENCY COMMUNICATION SYSTEM

(71) Applicant: Ningbo Semiconductor International Corporation, Ningbo (CN)

(72) Inventor: Hailong Luo, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 255 days.

(21) Appl. No.: 17/449,836

(22) Filed: Oct. 4, 2021

(65) Prior Publication Data
US 2022/0029603 A1    Jan. 27, 2022

Related U.S. Application Data

(63) Continuation of application No. PCT/CN2019/105094, filed on Sep. 10, 2019, and a
(Continued)

(30) Foreign Application Priority Data

Apr. 4, 2019  (CN) .......................... 201910272252.2
Apr. 4, 2019  (CN) .......................... 201910272274.9
(Continued)

(51) Int. Cl.
*H03H 9/02* (2006.01)
*H03H 9/13* (2006.01)
(Continued)

(52) U.S. Cl.
CPC ........ *H03H 9/173* (2013.01); *H03H 9/02015* (2013.01); *H03H 9/131* (2013.01); *H03H 9/54* (2013.01)

(58) Field of Classification Search
None
See application file for complete search history.

(56) References Cited

U.S. PATENT DOCUMENTS 8,653,908 B2 *  2/2014  Hara ...................... H03H 9/174
                                                              333/187
8,902,023 B2 * 12/2014  Choy ..................... H03H 9/173
                                                              310/365
(Continued)

FOREIGN PATENT DOCUMENTS

CN     1838531 A    9/2006
CN   103532516 A    1/2014
(Continued)

*Primary Examiner* — Kenneth B Wells
(74) *Attorney, Agent, or Firm* — Anova Law Group, PLLC

(57) ABSTRACT

A bulk acoustic wave resonator, a filter, and a radio frequency communication system are provided. The bulk acoustic wave resonator includes a substrate and a bottom electrode layer, where a cavity is formed therebetween. The bulk acoustic wave resonator also includes a piezoelectric layer formed on the bottom electrode layer and over the cavity, and a top electrode layer formed over the piezoelectric layer. At least one of the bottom electrode layer and the top electrode layer has a convex portion or concave portion. The convex portion is located in a region of the cavity and is protruded facing away from a bottom of the cavity, and the concave portion is located in the region of the cavity and is recessed towards the bottom of the cavity. Each of the convex portion and the concave portion is located in a peripheral region surrounding the piezoelectric layer.

20 Claims, 15 Drawing Sheets

Related U.S. Application Data continuation of application No. PCT/CN2019/105089, filed on Sep. 10, 2019, and a continuation of application No. PCT/CN2019/105093, filed on Sep. 10, 2019, and a continuation of application No. PCT/CN2019/105087, filed on Sep. 10, 2019, and a continuation of application No. PCT/CN2019/105088, filed on Sep. 10, 2019, and a continuation of application No. PCT/CN2019/105091, filed on Sep. 10, 2019, and a continuation of application No. PCT/CN2019/105092, filed on Sep. 10, 2019, and a continuation of application No. PCT/CN2019/105096, filed on Sep. 10, 2019.

(30) Foreign Application Priority Data

| Apr. 4, 2019 | (CN) | 201910272278.7 |
|---|---|---|
| Apr. 4, 2019 | (CN) | 201910272282.3 |
| Apr. 4, 2019 | (CN) | 201910273066.0 |
| Apr. 4, 2019 | (CN) | 201910273067.5 |
| Apr. 4, 2019 | (CN) | 201910273070.7 |
| Apr. 4, 2019 | (CN) | 201910273072.6 |

(51) Int. Cl.
*H03H 9/17* (2006.01)
*H03H 9/54* (2006.01)

(56) References Cited

U.S. PATENT DOCUMENTS

| 9,013,250 | B2* | 4/2015 | Taniguchi | H03H 9/02157 |
| | | | | 333/187 |
| 10,263,598 | B2* | 4/2019 | Shin | H03H 3/02 |
| 10,903,814 | B2* | 1/2021 | Han | H03H 9/02157 |
| 11,476,826 | B2* | 10/2022 | Han | H03H 9/17 |
| 2014/0203686 | A1 | 7/2014 | Song et al. | |
| 2018/0152168 | A1 | 5/2018 | Han et al. | |
| 2018/0205360 | A1 | 7/2018 | Han et al. | |
| 2018/0287584 | A1 | 10/2018 | Azarnaminy et al. | |

FOREIGN PATENT DOCUMENTS

| CN | 107094002 A | 8/2017 |
|---|---|---|
| CN | 107623502 A | 1/2018 |
| CN | 108123695 A | 6/2018 |
| CN | 108336982 A | 7/2018 |
| JP | H065746 A | 1/1994 |
| JP | 2005303573 A | 10/2005 |
| JP | 2006020277 A | 1/2006 |
| JP | 2006270506 A | 10/2006 |
| JP | 2006340256 A | 12/2006 |
| JP | 2007006501 A | 1/2007 |
| JP | 2009089006 A | 4/2009 |
| JP | 2009290371 A | 12/2009 |
| JP | 2010041153 A | 2/2010 |
| KR | 20110041814 A | 4/2011 |

* cited by examiner

BULK ACOUSTIC WAVE RESONATOR, FILTER AND RADIO FREQUENCY COMMUNICATION SYSTEM

CROSS-REFERENCES TO RELATED APPLICATIONS

This application is a continuation application of PCT Patent Applications No. PCT/CN2019/105092, filed on Sep. 10, 2019, which claims priority to Chinese patent application No. 201910272278.7, filed on Apr. 4, 2019; No. PCT/CN2019/105087, filed on Sep. 10, 2019, which claims priority to Chinese patent application No. 201910273070.7, filed on Apr. 4, 2019; No. PCT/CN2019/105094, filed on Sep. 10, 2019, which claims priority to Chinese patent application No. 201910273066.0, filed on Apr. 4, 2019; No. PCT/CN2019/105088, filed on Sep. 10, 2019, which claims priority to Chinese patent application No. 201910273067.5, filed on Apr. 4, 2019; No. PCT/CN2019/105093, filed on Sep. 10, 2019, which claims priority to Chinese patent application No. 201910273072.6, filed on Apr. 4, 2019; No. PCT/CN2019/105096, filed on Sep. 10, 2019, which claims priority to Chinese patent application No. 201910272252.2, filed on Apr. 4, 2019; No. PCT/CN2019/105089, filed on Sep. 10, 2019, which claims priority to Chinese patent application No. 201910272274.9, filed on Apr. 4, 2019; and No. PCT/CN2019/105091, filed on Sep. 10, 2019, which claims priority to Chinese patent application No. 201910272282.3, filed on Apr. 4, 2019, the entirety of all of which is incorporated herein by reference.

FIELD OF THE DISCLOSURE

The present disclosure generally relates to the field of radio frequency communication technology and, more particularly, relates to a bulk acoustic wave resonator, a filter, and a radio frequency communication system.

BACKGROUND

Radio frequency (RF) communication, such as communication used in a mobile phone, requires the use of a radio frequency filter. Each radio frequency filter is capable of transmitting the required frequency and limiting any other frequency. With the development of mobile communication technology, the amount of mobile data transmission has risen rapidly. Therefore, under the premise that frequency resources are limited and as few mobile communication devices as possible should be used, increasing the transmission power of a wireless power transmission device, such as a wireless base station, a micro base station, or a repeater, has become a problem that has to be considered. At the same time, the power requirements of the filter in the front-end circuit of mobile communication device become higher and higher.

At present, the high-power filter in the device such as the wireless base station is mainly a cavity filter, whose power can reach hundreds of watts, but the size of such filter is substantially large. Certain device uses a dielectric filter, whose average power can reach more than five watts, and the size of such filter is also substantially large. Due to the large size, two such filters cannot be integrated into the RF front-end chip.

As micro-electromechanical system (MEMS) technology becomes more and more mature, the filter composed of bulk acoustic wave (BAW) resonator well overcomes the shortcomings of the above two types of filters. The bulk acoustic wave resonator has incomparable volume advantage over the ceramic dielectric filter and incomparable operating frequency and power capacity advantages over the surface acoustic wave (SAW) resonator, and has become the development trend of today's wireless communication systems.

The main part of the bulk acoustic wave resonator has a sandwich structure composed of bottom electrode-piezoelectric film-top electrode. The inverse piezoelectric effect of the piezoelectric film is used to convert electrical energy into mechanical energy, to form a standing wave in the form of sound waves in the filter composed of the bulk acoustic wave resonator. Because the speed of acoustic wave is five orders of magnitude smaller than the speed of electromagnetic wave, the size of the filter composed of the bulk acoustic wave resonators is smaller than the size of the conventional dielectric filter.

The working principle of one cavity-type bulk acoustic wave resonator includes using the reflection of acoustic waves on the interface between the bottom electrode or the supporting layer and the air, to confine the acoustic waves in the piezoelectric layer to achieve resonance. The cavity-type bulk acoustic wave resonator is featured with advantages such as a high quality factor (Q) value, low insertion loss, and integrable, etc., and has been widely used.

However, the quality factor (Q) of the currently manufactured cavity-type bulk acoustic wave resonator cannot be further improved, and, thus, cannot meet the requirements of the high-performance radio frequency system. The disclosed bulk acoustic wave resonator, filter, and radio frequency communication system are directed to solve one or more problems set forth above and other problems in the art.

BRIEF SUMMARY OF THE DISCLOSURE

One aspect of the present disclosure provides a bulk acoustic wave resonator. The bulk acoustic wave resonator includes a substrate, and a bottom electrode layer disposed over the substrate. A cavity is formed between the bottom electrode layer and the substrate. The bulk acoustic wave resonator also includes a piezoelectric layer formed on the bottom electrode layer and over the cavity, and a top electrode layer formed over the piezoelectric layer. At least one of the bottom electrode layer and the top electrode layer has a convex portion or concave portion. The convex portion is located in a region of the cavity and is protruded facing away from a bottom of the cavity, and the concave portion is located in the region of the cavity and is recessed towards the bottom of the cavity. Each of the convex portion and the concave portion is located in a peripheral region surrounding the piezoelectric layer.

Another aspect of the present disclosure provides a filter. The filter includes a bulk acoustic wave resonator. The bulk acoustic wave resonator includes a substrate, and a bottom electrode layer disposed over the substrate. A cavity is formed between the bottom electrode layer and the substrate. The bulk acoustic wave resonator also includes a piezoelectric layer formed on the bottom electrode layer and over the cavity, and a top electrode layer formed over the piezoelectric layer. At least one of the bottom electrode layer and the top electrode layer has a convex portion or concave portion. The convex portion is located in a region of the cavity and is protruded facing away from a bottom of the cavity, and the concave portion is located in the region of the cavity and is recessed towards the bottom of the cavity. Each of the convex portion and the concave portion is located in a peripheral region surrounding the piezoelectric layer.

Another aspect of the present disclosure provides a radio frequency communication system. The radio frequency communication system includes a filter including a bulk acoustic wave resonator. The bulk acoustic wave resonator includes a substrate, and a bottom electrode layer disposed over the substrate. A cavity is formed between the bottom electrode layer and the substrate. The bulk acoustic wave resonator also includes a piezoelectric layer formed on the bottom electrode layer and over the cavity, and a top electrode layer formed over the piezoelectric layer. At least one of the bottom electrode layer and the top electrode layer has a convex portion or concave portion. The convex portion is located in a region of the cavity and is protruded facing away from a bottom of the cavity, and the concave portion is located in the region of the cavity and is recessed towards the bottom of the cavity. Each of the convex portion and the concave portion is located in a peripheral region surrounding the piezoelectric layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. However, those skilled in the art may easily understand that the present disclosure may be implemented without one or more of these details. In certain examples, some well-known technical features in the art are not described herein to avoid confusion with the present disclosure.

Exemplary Embodiment 1

Figure 1A:
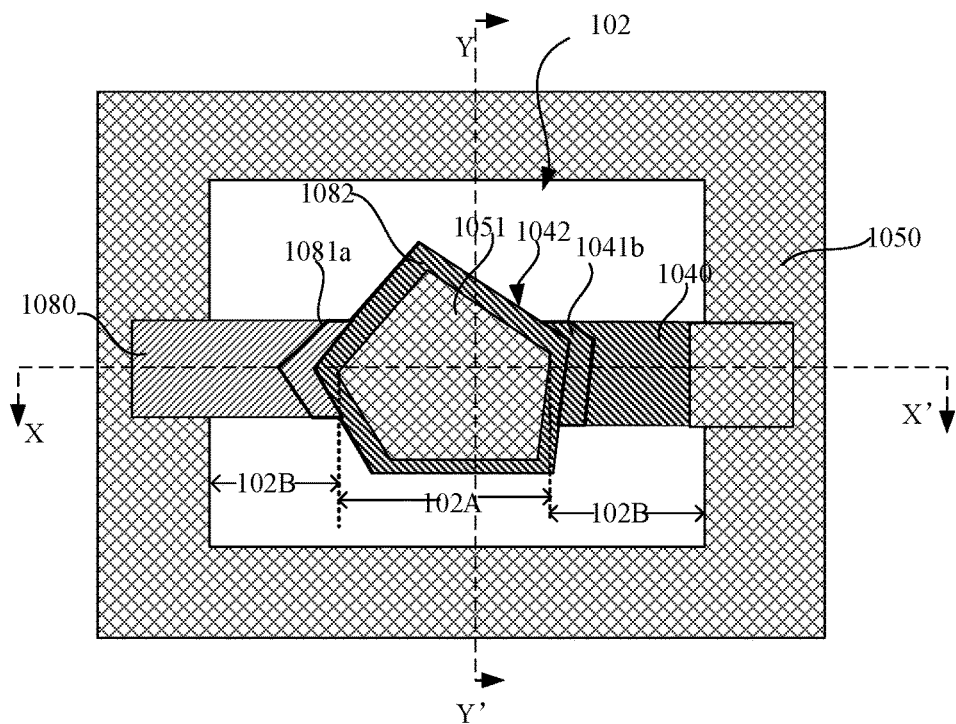
FIG. 1A illustrates a schematic top view of an exemplary bulk acoustic wave resonator consistent with various disclosed embodiments of the present disclosure.
Figure 1B:
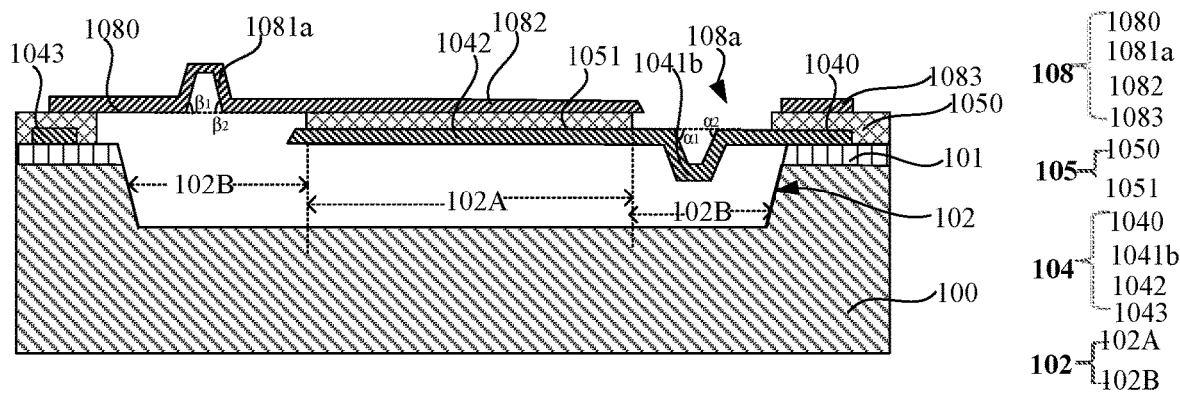
FIG. 1B illustrates a XX'-sectional view of an exemplary bulk acoustic wave resonator in FIG. 1A consistent with various disclosed embodiments of the present disclosure.
Figure 1C:
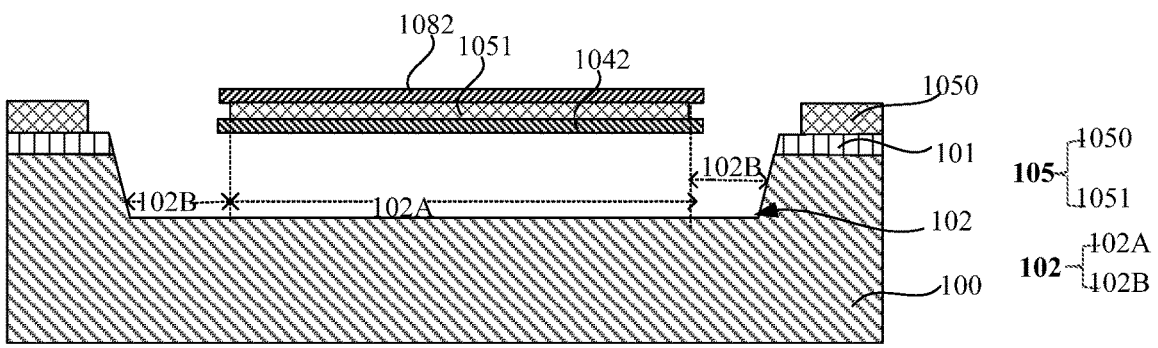
FIG. 1C illustrates a YY'-sectional view of an exemplary bulk acoustic wave resonator in FIG. 1A consistent with various disclosed embodiments of the present disclosure.

The present disclosure provides a bulk acoustic wave resonator. FIG. 1A illustrates a schematic top view of a bulk acoustic wave resonator consistent with various disclosed embodiments of the present disclosure; FIG. 1B illustrates a XX'-sectional view of the bulk acoustic wave resonator in FIG. 1A, and FIG. 1C illustrates a YY'-sectional view of the bulk acoustic wave resonator in FIG. 1A. The bulk acoustic wave resonator may include a substrate, a bottom electrode layer 104, a piezoelectric layer 1051, and a top electrode layer 108.

The substrate may include a base 100 and an etching protection layer 101 covering the base 100. The base 100 may be any suitable substrate known to those skilled in the art, such as a semiconductor wafer, a single-layer or multi-layer structure composed of semiconductor materials, or a ceramic such as alumina substrate, a quartz substrate, or a glass substrate, etc. The etching protection layer 101 may be made of any suitable dielectric material, including but not limited to at least one of silicon oxide, silicon nitride, silicon oxy-nitride, and silicon carbo-nitride, etc.

A cavity 102 may be formed between the bottom electrode layer 104 and the substrate. Referring to FIGS. 1A-1C, in one embodiment, the cavity 102 may be formed by sequentially etching the etching protection layer 101 and a portion of the base 100 along a thickness direction through an etching process, and may have a groove structure having an entirety of the bottom recessed into the substrate.

Figure 2A:
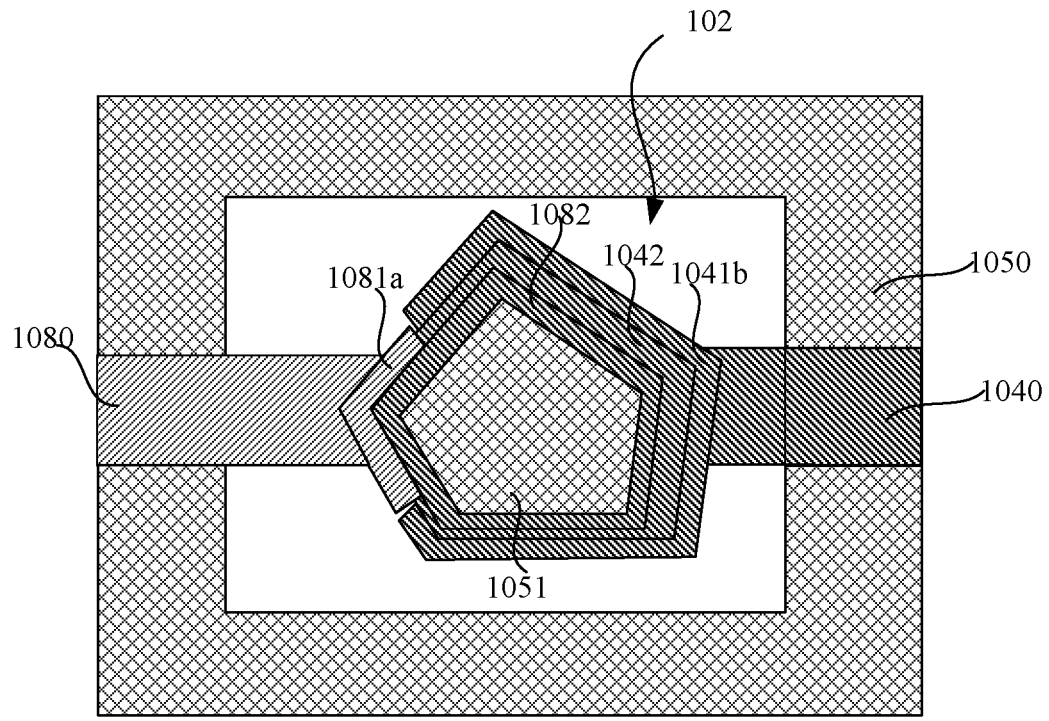
FIG. 2A illustrates a schematic top view of another exemplary bulk acoustic wave resonator consistent with various disclosed embodiments of the present disclosure.
Figure 2B:
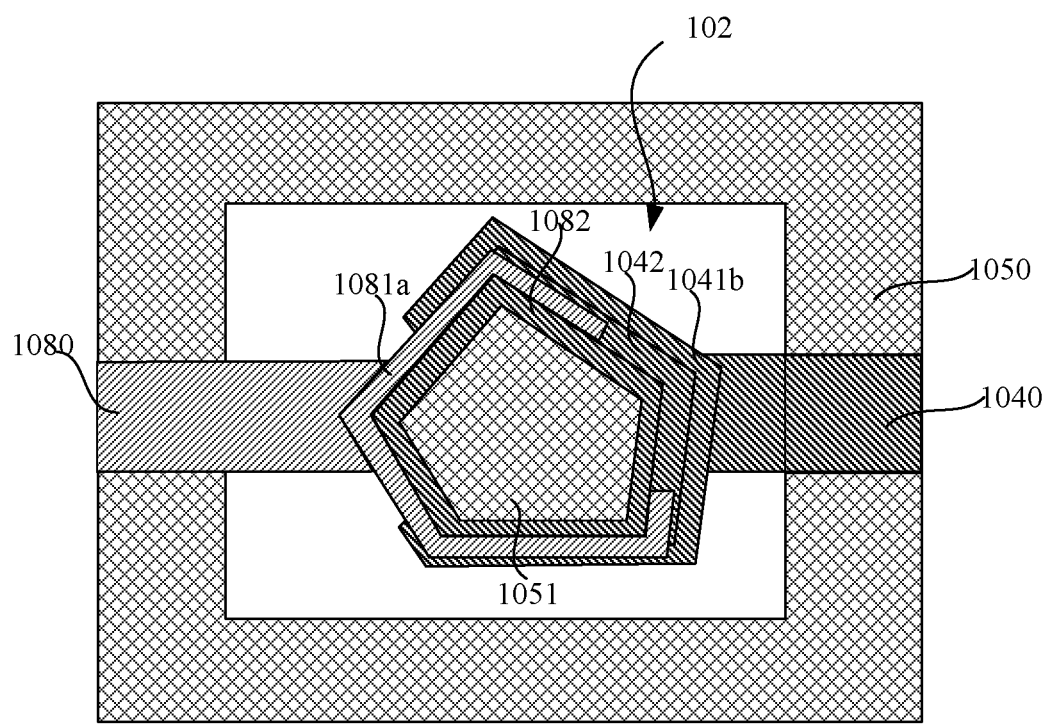
FIG. 2B illustrates a schematic top view of another exemplary bulk acoustic wave resonator consistent with various disclosed embodiments of the present disclosure.
Figure 2C:
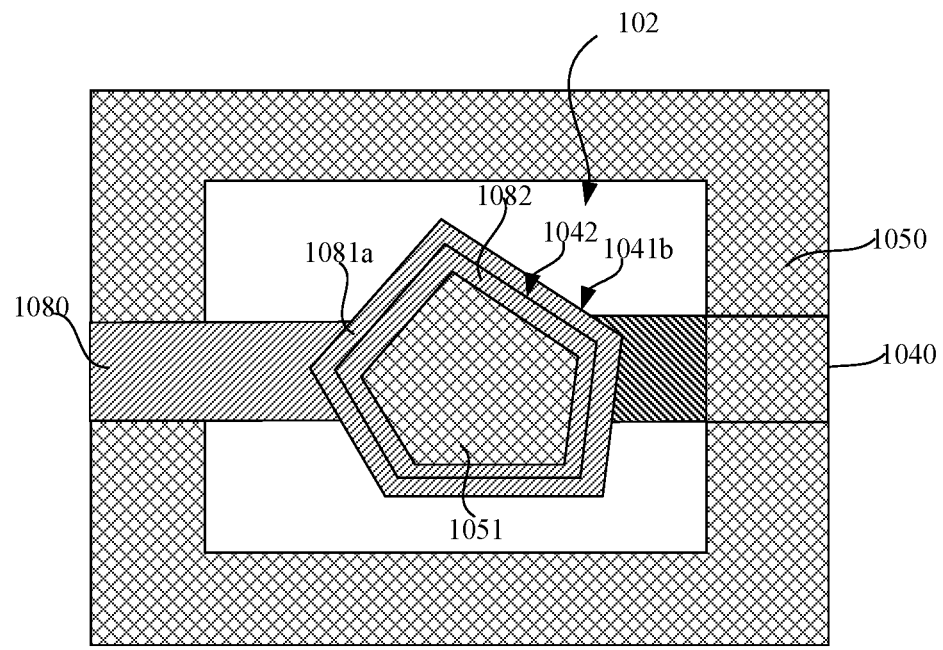
FIG. 2C illustrates a schematic top view of another exemplary bulk acoustic wave resonator consistent with various disclosed embodiments of the present disclosure.
Figure 2D:
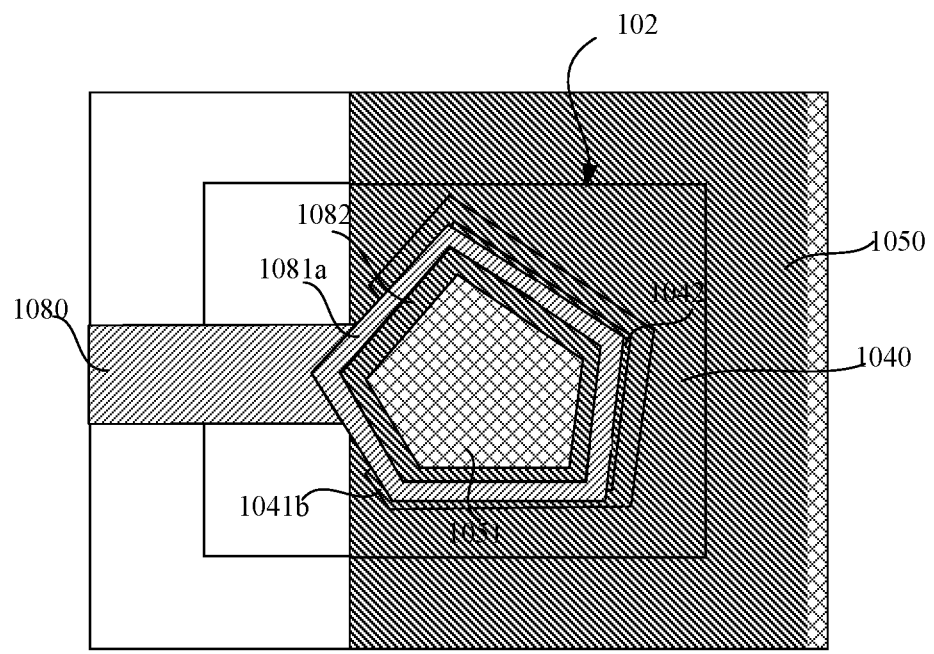
FIG. 2D illustrates a schematic top view of another exemplary bulk acoustic wave resonator consistent with various disclosed embodiments of the present disclosure.
Figure 2E:
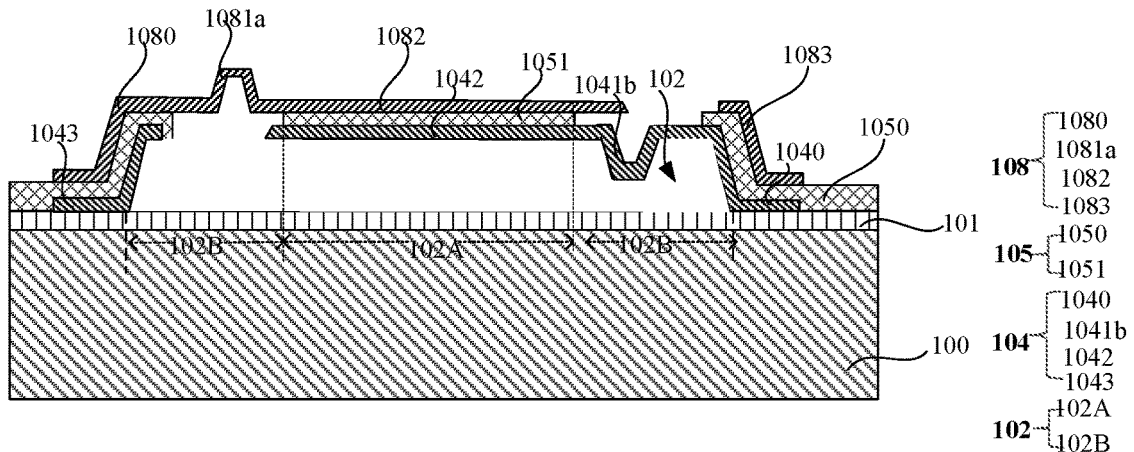
FIG. 2E illustrates a schematic cross-sectional view of another exemplary bulk acoustic wave resonator consistent with various disclosed embodiments of the present disclosure.

In another embodiment, referring to FIG. 2E, the cavity 102 may be formed over the top surface of the etching protection layer 101 by removing a sacrificial layer protruded on the surface of the etching protection layer 101, and may have a cavity structure overall protruded on the surface of the etching protection layer 101. In addition, in one embodiment, the bottom surface of the cavity 102 may have a rectangular shape. In certain embodiments, the bottom surface of the cavity 102 may have a circular shape, an ellipse shape, or a polygon other than a rectangle, such as pentagon, hexagon, etc.

The piezoelectric layer 1051 may be referred to a piezoelectric resonator located in an upper region of the cavity 102 (in other words, located in the region of the cavity 102), which may correspond to an effective working region of the bulk acoustic wave resonator. The piezoelectric layer 1051 may be disposed between the bottom electrode layer 104 and the top electrode layer 108.

In one embodiment, the bottom electrode layer 104 may include a bottom electrode lap portion 1040, a bottom electrode concave portion 1041b, and a bottom electrode resonance portion 1042 that are sequentially connected. The top electrode layer 108 may include a top electrode lap portion 1080, a top electrode convex portion 1081a and a top electrode resonance portion 1082 that are sequentially connected. A partial region of the cavity 102 corresponding to the bottom electrode resonator portion 1042, the piezoelectric layer 1051, and the top electrode resonator portion 1082 that are overlapped may refer to an effective working region 102A of the bulk acoustic wave resonator, and the other region of the cavity 102 except for the effective working region 102A may refer to an ineffective region 102B. The piezoelectric layer 1051 may be located in the effective working region 102A, and may be separated from any other film layer around the cavity 102, which may reduce the influence of the film layer around the cavity on the longitudinal vibration of the piezoelectric layer, may reduce the parasitic parameters generated in the ineffective region 102B, and may improve the device performance.

The bottom electrode concave portion 1041b may be located over the ineffective region 102B at the periphery of the effective working region 102A, may be electrically connected to the bottom electrode resonance portion 1042, and may be recessed towards the bottom surface of the cavity 102. The top electrode convex portion 1081a may be located over the ineffective region 102B at the periphery of the effective working region 102A, may be electrically connected to the top electrode resonance portion 1082, and may be protruded away from the bottom surface of the cavity 102.

Both the top electrode convex portion 1081a and the bottom electrode concave portion 1041b may be located in the cavity region (i.e. the ineffective region 102B) at the periphery of the piezoelectric layer 1051. The bottom electrode concave portion 1041b and the top electrode convex portion 1081a may have a solid structure or a hollow structure. In one embodiment, the bottom electrode concave portion 1041b and the top electrode convex portion 1081a may have a hollow structure, such that the bottom electrode layer 104 and the top electrode layer 108 may have a uniform film thickness, which may avoid collapse and deformation caused by gravity of the solid structure, and may further improve the resonance factor. Both the bottom electrode resonance portion 1042 and the top electrode resonance portion 1082 may have a polygon shape (both the top surface and the bottom surface may have a polygon shape). The bottom electrode resonance portion 1042 and the top electrode resonance portion 1082 may have a similar shape (as shown in FIGS. 2A-2B and FIG. 2D), or an exact same shape (as shown in FIG. 1A and FIG. 2C). The piezoelectric layer 1051 may have a polygon shape similar as the bottom electrode resonance portion 1042 and the top electrode resonance portion 1082.

Referring to FIGS. 1A-1C, in one embodiment, the bottom electrode layer 104, the piezoelectric layer 1051 and the top electrode layer 108 may form a watch-shaped film structure lapped on the substrate. The bottom electrode lap portion 1040 and the top electrode lap portion 1080 may be equivalent to two straps of the watch.

The bottom electrode concave portion 1041b may be disposed along an edge of the bottom electrode resonance portion 1042, and may merely be disposed in a region where the bottom electrode lap portion 1040 and the bottom electrode resonance portion 1042 are aligned. The top electrode convex portion 1081a may be disposed along an edge of the top electrode resonance portion 1082, and may merely be disposed in a region where the top electrode lap portion 1080 and the top electrode resonance portion 1082 are aligned. The bottom electrode concave portion 1041b and the top electrode convex portion 1081a may be equivalent to a connection structure between the dial of the watch and the two straps. The stacked structure of the bottom electrode resonance portion 1042, the piezoelectric layer 1051 and the top electrode resonance portion 1082 in the effective region 102A may be equivalent to the dial of the watch. The strap portion of the dial may be connected to the film layer over the substrate surrounding the cavity, and the remaining portion of the dial may be separated from the film layer over the substrate surrounding the cavity through the cavity. In certain embodiments, the bottom electrode layer and the top electrode layer each may have a plurality of separated lap portions, to provide effective support.

In one embodiment, the plane where the piezoelectric layer 1051 is located may be a reference plane. The top electrode convex portion 1081*a* and the bottom electrode concave portion 1041*b* may be disposed on both sides of the piezoelectric layer 1051 and may be fully opposite to each other. Therefore, the transverse wave may be blocked to a certain extent, and at the same time, the area of the ineffective region 102B not covered by the top electrode lap portion 1080 and the bottom electrode lap portion 1040 may be reduced, which may facilitate to reduce the device size, may facilitate to reduce the area of the top electrode lap portion 1080 and the bottom electrode lap portion 1040, may further reduce parasitic parameters, and may improve the electrical performance of the device. The bottom electrode lap portion 1040 and the top electrode lap portion 1080 may be staggered in the cavity 102 (in other words, the two may not overlap each other), thereby reducing the parasitic parameters, avoiding the electrical leakage, short circuit and any other problem caused by the contact between the bottom electrode lap portion and the top electrode lap portion, and improving the device performance.

Time-varying voltages may be applied to the bottom electrode resonance portion 1042 and the top electrode resonance portion 1082 through the bottom electrode lap portion 1040 and the top electrode lap portion 1080, respectively, to excite a longitudinal extension mode or a "piston" mode. The piezoelectric layer 1051 may convert electrical energy into longitudinal waves, while parasitic transverse waves may also be generated in such process. The bottom electrode concave portion 1041*b* and the top electrode convex portion 1081*a* may prevent the transverse waves from propagating to the film layers around the cavity and may limit the transverse waves in the region of the cavity 102, thereby avoiding energy loss caused by the transverse waves and improving the quality factor.

Line widths of the top electrode convex portion 1081*a* and the bottom electrode concave portion 1041*b* may be a minimum line width allowed by the corresponding process. A horizontal distance between the bottom electrode concave portion 1041*b* and the piezoelectric layer 1051, and a horizontal distance between the top electrode convex portion 1081*a* and the piezoelectric layers 1051 may be the minimum distance allowed by the corresponding process. Therefore, while enabling the top electrode convex portion 1081*a* and the bottom electrode concave portion 1041*b* to block the transverse waves to a certain extent, the device area may be reduced.

In addition, the sidewall of the top electrode convex portion 1081*a* may be an inclined sidewall with respect to the top surface of the piezoelectric layer. Referring to FIG. 1B, a cross-section of the top electrode convex portion 1081*a* along the XX' direction in FIG. 1A may have a trapezoidal or trapezoid-like structure. The angles $\beta 1$ and $\beta 2$ between the sidewalls of the top electrode convex portion 1081*a* and the top surface of the piezoelectric layer 1051 may be less than or equal to 45°. Therefore, the top electrode convex portion 1081*a* may be prevented from being break due to vertical sidewalls of the top electrode convex portion 1081*a*, the effect of transmitting signals to the top electrode resonance portion 1082 may be prevented from being affected, and at the same time, the thickness uniformity of the entire top electrode layer 108 may be improved. The sidewall of the bottom electrode concave portion 1041*b* may be an inclined sidewall with respect to the bottom surface of the piezoelectric layer. Referring to FIG. 1B, a cross-section of the bottom electrode concave portion 1041*b* along the XX' direction in FIG. 1A may have a trapezoidal or trapezoid-like structure. The angles $\alpha 1$ and $\alpha 2$ between the sidewalls of the bottom electrode concave portion 1041*b* and the bottom surface of the piezoelectric layer 1051 may be less than or equal to 45°. Therefore, the bottom electrode layer 104 may be prevented from being break due to vertical sidewalls of the bottom electrode concave portion 1041*b*, the effect of transmitting signals to the bottom electrode resonance portion 1042 may be prevented from being affected, and at the same time, the thickness uniformity of the entire bottom electrode layer 104 may be improved.

In one embodiment, the bottom electrode resonance portion 1042, the bottom electrode concave portion 1041*b*, and the bottom electrode lap portion 1040 may be formed using a same film layer manufacturing process (in other words, formed in a single film layer manufacturing process). The top electrode resonance portion 1082, the top electrode convex portion 1081*a* and the top electrode lap portion 1080 may be formed using a same film layer manufacturing process (in other words, formed in a single film layer manufacturing process). Therefore, the manufacturing process may be simplified, and the cost may be reduced. The film layers of the bottom electrode layer and the top electrode layer may be made of any suitable conductive material or semiconductor material. The conductive material may include a conductive metal material, e.g., one or more of aluminum (Al), copper (Cu), platinum (Pt), gold (Au), molybdenum (Mo), tungsten (W), iridium (Ir), osmium (Os), rhenium (Re), palladium (Pd), rhodium (Rh) and ruthenium (Ru). The semiconductor material may include Si, Ge, SiGe, SiC, SiGeC, etc. In certain embodiments, under the premise of process cost and process technology permitting, the bottom electrode resonator portion 1042, the bottom electrode concave portion 1041*b*, and the bottom electrode lap portion 1040 may be formed using different film layer manufacturing processes, and the top electrode resonance portion 1082, the top electrode convex portion 1081*a*, and the top electrode lap portion 1080 may be formed using different film layer manufacturing processes.

Referring to FIGS. 2A-2D, to further improve the effect of blocking transverse waves, the bottom electrode concave portion 1041*b* may be extended to more continuous edges of the bottom electrode resonance portion 1042, and the top electrode convex portion 1081*a* may be extended to more continuous edges of the top electrode resonance portion 1082.

In one embodiment, referring to FIG. 2A, the projections of the bottom electrode concave portion 1041*b* and the top electrode convex portion 1081*a* on the bottom surface of the cavity 102 may be just or nearly connected with each other. In other words, the projections of the bottom electrode concave portion 1041*b* and the top electrode convex portion 1081*a* on the bottom surface of the cavity 102 may form a fully closed ring or nearly closed ring. Therefore, through the cooperation of the bottom electrode concave portion 1041*b* and the top electrode convex portion 1081*a*, the transverse waves at the entire periphery of the piezoelectric layer 1051 may be blocked. In view of this, the size of projections of the bottom electrode concave portion 1041*b* and the top electrode convex portion 1081*a* on the bottom surface of the cavity 102 may be equally divided or unevenly divided in the ring formed by the combination of the two projections. In other words, the bottom electrode concave portion 1041*b* and the top electrode convex portion 1081*a* may be located on both sides of the piezoelectric layer 1051 and all parts may be fully opposite, or the bottom electrode concave portion 1041*b* and the top electrode convex portion 1081*a* may be located on both sides of the piezoelectric layer 1051 and may be partly opposite.

In another embodiment, referring to FIG. 2B, the bottom electrode concave portion 1041*b* may be disposed on each edge of the bottom electrode resonance portion 1042 and may be connected to each edge. The top electrode convex portion 1081*a* may be disposed on each edge of the top electrode resonance portion 1082 and may be connected to each edge. The projection of the bottom electrode concave portion 1041*b* on the bottom surface of the cavity 102 may expose a partial or full projection of the boundary of the top electrode convex portion 1081*a* connected to the top electrode lap portion 1080 on the bottom surface of the cavity 102. The projection of the top electrode convex portion 1081*a* on the bottom surface of the cavity 102 may expose a partial or full projection of the boundary of the bottom electrode concave portion 1041*b* connected to the bottom electrode lap portion 1040 on the bottom surface of the cavity 102. Therefore, the bottom electrode concave portion 1041*b* may not overlap the top electrode lap portion 1080, and the top electrode convex portion 1081*a* may not overlap the bottom electrode lap portion 1040, thereby reducing the parasitic parameters.

In addition, the bottom electrode concave portion 1041*b* and the top electrode convex portion 1081*a* may be partially staggered or even fully staggered from each other. In other words, in view of this, the bottom electrode concave portion 1041*b* and the top electrode convex portion 1081*a* may be partially aligned or fully staggered up and down along a direction perpendicular to the piezoelectric layer 1051, but all parts at the peripheral direction of the piezoelectric layer 1051 may be opposite with each other. Therefore, the projection of the bottom electrode concave portion 1041*b* on the bottom surface of the cavity may partially surround the projection of the top electrode convex portion 1081*a* on the bottom surface of the cavity. In view of this, through the cooperation of the bottom electrode concave portion 1041*b* and the top electrode convex portion 1081*a*, not only the transverse waves at the entire periphery of the piezoelectric layer 1051 may be blocked, but also the alignment requirements of the bottom electrode concave portion 1041*b* and the top electrode convex portion 1081*a* may be reduced, which may facilitate to reduce the difficulty of manufacturing process.

In another embodiment, referring to FIG. 2C, the bottom electrode concave portion 1041*b* may fully surround the bottom electrode resonance portion 1042, and the top electrode convex portion 1081*a* may fully surround the top electrode resonance portion 1082. The projections of the bottom electrode concave portion 1041*b* and the top electrode convex portion 1081*a* on the bottom surface of the cavity 102 may overlap each other, and the projections of the top electrode resonance portion 1082 and the bottom electrode resonance portion 1042 on the bottom surface of the cavity 102 may overlap each other. Therefore, each of the bottom electrode concave portions 1041*b* and the top electrode convex portions 1081*a* having different heights along a vertical direction may have a closed ring shape, which may block transverse waves at different heights generated by the piezoelectric layer 1051. In other words, when the bottom electrode concave portion 1041*b* is extended to more continuous edges of the bottom electrode resonance portion 1042, and the top electrode convex portion 1081*a* is extended to more continuous edges of the top electrode resonance portion 1082, the bottom electrode concave portion 1041*b* and the top electrode convex portion 1081*a* each may be extended around the peripheral direction of the piezoelectric layer 1051, and the bottom electrode concave portion 1041*b* and the top electrode convex portion 1081*a* may partially surround the periphery of the piezoelectric layer 1051 (as shown in FIGS. 2A-2B) along the peripheral direction of the piezoelectric layer 1051, respectively.

In view of this, the top electrode convex portion 1081*a* and the bottom electrode concave portion 1041*b* may be at least partially opposite, or the bottom electrode concave portion 1041*b* and the top electrode convex portion 1081*a* may fully surround the piezoelectric layer 1051 along the peripheral direction of the piezoelectric layer 1051 (as shown in FIG. 2C), respectively. The top electrode convex portion 1081*a* and the bottom electrode concave portion 1041*b* may be fully opposite.

Referring to FIGS. 2A-2D, in one embodiment, the bottom electrode lap portion 1040 may be electrically connected to at least one edge or at least one corner of the bottom electrode concave portion 1041*b* facing away from the bottom electrode resonance portion 1042, and may be extended from the corresponding edge of the bottom electrode concave portion 1041*b* to a region above a portion of the etching protection layer 101 on the periphery of the cavity 102 through the cavity (i.e., 102B) outside of the bottom electrode concave portion 1041*b*. The top electrode lap portion 1080 may be electrically connected to at least one edge or at least one corner of the top electrode convex portion 1081*a* facing away from the top electrode resonance portion 1082, and may be extended from the top electrode convex portion 1081*a* to a region above a portion of the etching protection layer 101 on the periphery of the cavity 102 through the cavity (i.e., 102B) suspended over the outside of the top electrode convex portion 1081*a*. The projections of the top electrode lap portion 1080 and the bottom electrode lap portion 1040 on the bottom surface of the cavity 102 may be just connected with or separated from each other. Therefore, the top electrode lap portion 1080 and the bottom electrode lap portion 1040 may not overlap each other and may be staggered in the region over the cavity 102.

For example, as shown in FIG. 1A and FIGS. 2A-2C, the bottom electrode lap portion 1040 may merely be extended above a portion of the substrate at the periphery of one edge of the cavity 102, and the top electrode lap portion 1080 may merely be extended above a portion of substrate at the periphery of another edge of the cavity 102. The projections of the top electrode lap portion 1080 and the bottom electrode lap portion 1040 on the bottom surface of the cavity 102 may be separated from each other, thereby avoiding the parasitic parameters and possible problems such as leakage and short circuit introduced when the top electrode lap portion 1080 overlaps the bottom electrode lap portion 1040.

In one embodiment, referring to FIG. 2D, when the bottom electrode concave portion 1041*b* is disposed along multiple consecutive edges of the bottom electrode resonance portion 1042, the bottom electrode lap portion 1040 may be disposed along all edges of the bottom electrode resonance portion 1042 facing away from the bottom electrode concave portion 1041*b*, and may be continuously extended to the substrate on the periphery of the cavity 102. Therefore, the bottom electrode lap portion 1040 may be extended to a region above a portion of the substrate in multiple directions on the periphery of the cavity 102. In other words, in view of this, the bottom electrode lap portion 1040 over the cavity may fully cover the cavity 102. Therefore, the large-area bottom electrode lap portion 1040 may be provided to enhance the supporting force of the film layer of the effective working region 102A and to prevent the cavity 102 from being collapsed.

Further, in one embodiment, when the bottom electrode lap portion 1040 is extended to a region above a portion of the substrate in multiple directions on the periphery of the cavity 102, the top electrode lap portion 1080 may merely be extended to a region above a portion of the substrate in one direction on the periphery of the cavity 102. For example, when the top-view shape of the cavity 102 is rectangular, the top electrode lap portion 1080 may merely be extended to a region above the substrate on the periphery of one edge of the cavity 102, and the bottom electrode lap portion 1040 may be extended to the other three edges of the cavity 102. In view of this, the projections of the top electrode lap portion 1080 and the bottom electrode lap portion 1040 on the bottom surface of the cavity 102 may be just connected with or separated from each other. In other words, in view of this, a portion of the bottom electrode lap portion 1040 over the cavity may fully cover the cavity 102, and may not overlap the top electrode lap portion 1080 in the width direction of the top electrode lap portion 1080. Therefore, the large-area top electrode lap portion may be prevented from overlapping the bottom electrode lap portion and any other structure in the vertical direction to introduce excessive parasitic parameters, which may further improve the electrical performance and reliability of the device.

In various embodiments of the present disclosure, when the top-view shape of the cavity 102 is a polygon, the bottom electrode lap portion 1040 and the top electrode lap portion 1080 may expose at least one edge of the cavity, respectively. Therefore, at least one end of the bottom electrode resonance portion 1042 connected to the bottom electrode concave portion 1041b and at least one end of the top electrode resonance portion 1082 connected to the top electrode convex portion 1081a may be fully suspended, respectively, which may facilitate to reduce the area of the ineffective region 102B, thereby reducing the parasitic parameters such as the parasitic capacitance generated in the ineffective region 102B, and improving the device performance.

Optionally, the bottom electrode concave portion 1041b over the cavity 102 may be at least staggered from the top electrode lap portion 1080. In other words, the bottom electrode concave portion and the top electrode lap portion may not overlap each other in the cavity region. The top electrode convex portion 1081a over the cavity 102 may be at least staggered from the bottom electrode lap portion 1040. In other words, the top electrode convex portion 1081a and the bottom electrode lap portion 1040 may not overlap each other in the cavity region. The projections of the top electrode convex portion 1081a and the bottom electrode concave portion 1041b on the bottom surface of the cavity 102 may be just connected with, or staggered from, or partially overlap each other, thereby further reducing parasitic parameters such as parasitic capacitance generated in the ineffective region 102B, and improving device performance.

It should be noted that, to effectively block the transverse waves and to facilitate the manufacture of small-sized devices, the top electrode convex portion 1081a and the bottom electrode concave portion 1041b may be substantially close to the effective working region 102A, and the line widths of the top electrode convex portion 1081a and the bottom electrode concave portion 1041b may be as small as possible. Optionally, the line widths of the top electrode convex portion 1081a and the bottom electrode concave portion 1041b may be the minimum line width allowed by the corresponding process, respectively. The horizontal distances between the top electrode convex portion 1081a as well as the bottom electrode concave portion 1041b and the effective working region 102A (i.e., the piezoelectric layer 1051) may be the minimum distance allowed by the corresponding process, respectively.

It should be noted that in the foregoing embodiments, the top electrode resonance portion 1082 and the bottom electrode resonance portion 1042 may have a same or similar shape, and may have a same area. In another embodiment, the area of the bottom electrode resonance portion 1042 may be larger than the area of the top electrode resonance portion 1082, which may not be limited by the present disclosure. In certain embodiments, the top electrode resonance portion 1082 may not have a similar shape as the bottom electrode resonance portion 1042. The shapes of the top electrode convex portion 1081a and the bottom electrode concave portion 1041b may be compatible with the shape of the piezoelectric layer 1051, and may be extended along at least one edge of the piezoelectric layer 1051.

In the above embodiment, the top electrode layer 108 may include the top electrode convex portion 1081a, and the bottom electrode layer 104 may include the bottom electrode concave portion 104b. In certain embodiments, when merely the structure between the resonance portion and the lap portion of each of the top electrode layer and the bottom electrode layer is changed without changing the other structure, the parasitic transverse waves may also be suppressed.

Changing the structure between the resonance portion and the lap portion of each of the top electrode layer and the bottom electrode layer may include changing the pairing relationship between the convex portion or concave portion of the top electrode layer and the convex portion or concave portion of the bottom electrode layer. For example, referring to FIG. 3, the top electrode layer 108 may include a top electrode concave portion 1081b, and the bottom electrode layer 104 may include the bottom electrode concave portion 1041b. Referring to FIG. 4, the top electrode layer 108 may include the top electrode convex portion 1081a, and the bottom electrode layer 104 may include a bottom electrode convex portion 1041a.

Figure 4:
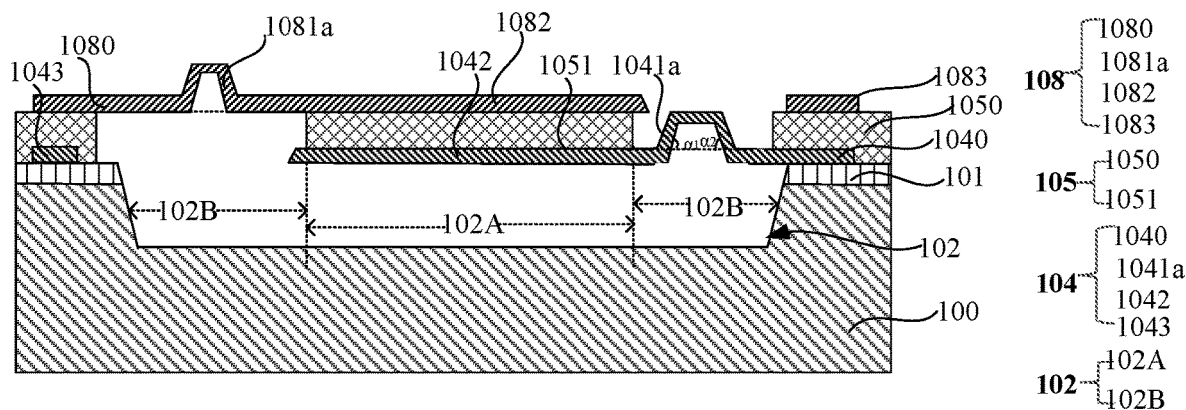
FIG. 4 illustrates a schematic cross-sectional view of another exemplary bulk acoustic wave resonator consistent with various disclosed embodiments of the present disclosure.
Figure 5:
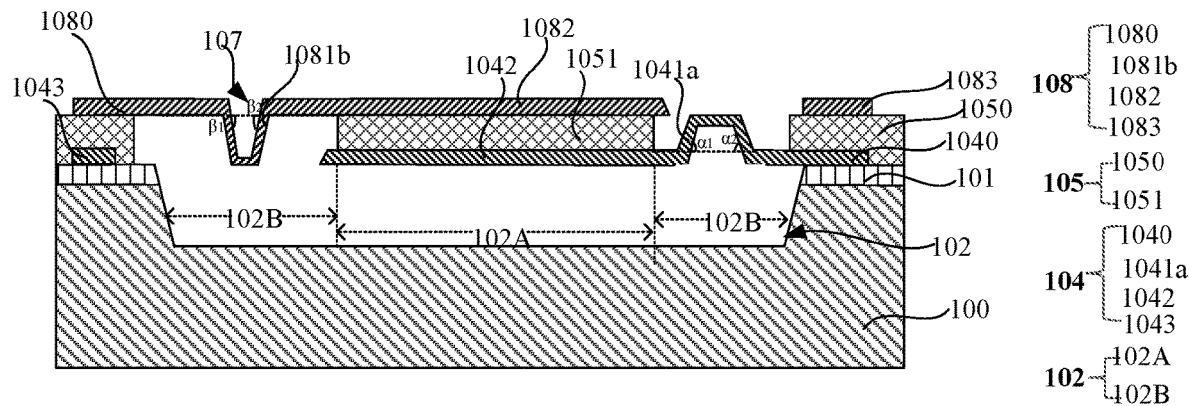
FIG. 5 illustrates a schematic cross-sectional view of another exemplary bulk acoustic wave resonator consistent with various disclosed embodiments of the present disclosure.
Figure 6:
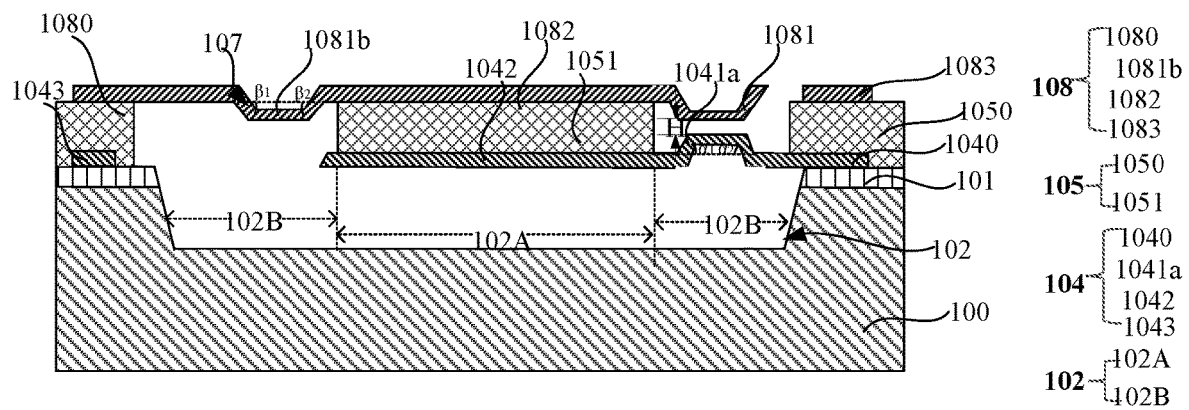
FIG. 6 illustrates a schematic cross-sectional view of another exemplary bulk acoustic wave resonator consistent with various disclosed embodiments of the present disclosure.

Referring to FIG. 5 and FIG. 6, the top electrode layer 108 may include the top electrode concave portion 1081b, and the bottom electrode layer 104 may include the bottom electrode convex portion 1041a. The difference between the embodiments associated with FIG. 5 and FIG. 6 may include that the heights of the protrusions of the bottom electrode convex portions 1041a or depressions of the top electrode concave portions 1081b may be different. When the bottom electrode convex portion 1041a is extended to more continuous edges of the bottom electrode resonance portion 1042, the top electrode concave portion 1081b is extended to more continuous edges of the top electrode resonance portion 1082, and the bottom electrode convex portion 1041a overlaps the top electrode concave portion 1081b, referring to FIG. 6, the bottom electrode convex portion 1041a and the top electrode concave portion 1081b may be spaced apart by a gap H, such that the top electrode layer 108 may not be electrically connected to the bottom electrode layer 104, thereby avoiding the short circuit problem. The structure and positional relationship between the protrusions or depressions of the top electrode layer and the protrusions or depressions of the bottom electrode layer in FIGS. 3-6 may be analogous to corresponding descriptions in the foregoing embodiments.

In addition, changing the structure between the resonance portion and the lap portion of each of the top electrode layer and the bottom electrode layer may include merely one of the top electrode layer and the bottom electrode layer has a protrusion or a depression, and a portion of the other one of the top electrode layer and the bottom electrode layer over the cavity 102 may be extended flat.

Figure 7:
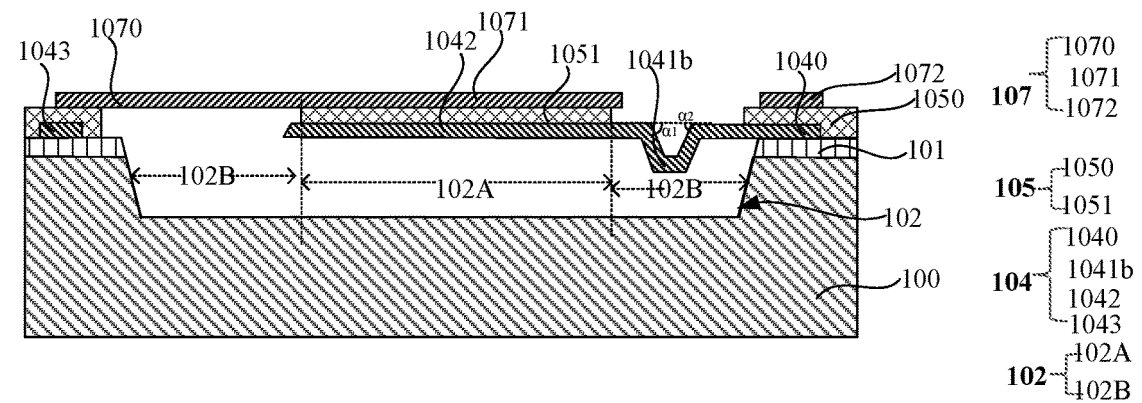
FIG. 7 illustrates a schematic cross-sectional view of another exemplary bulk acoustic wave resonator consistent with various disclosed embodiments of the present disclosure.
Figure 8:
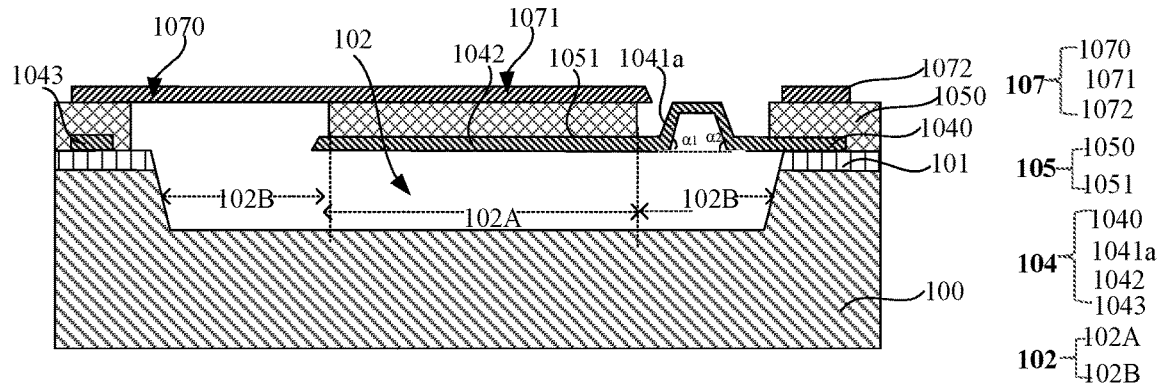
FIG. 8 illustrates a schematic cross-sectional view of another exemplary bulk acoustic wave resonator consistent with various disclosed embodiments of the present disclosure.

In one embodiment, referring to FIG. 7, a portion of the top electrode layer 107 over the cavity 102 may be extended flat, and the bottom electrode layer 104 may include the bottom electrode concave portion 1041b. Referring to FIG. 8, a portion of the top electrode layer 107 over the cavity 102 may be extended flat, and the bottom electrode layer 104 may include a bottom electrode convex portion 1041a. The top electrode layer 107 may include the top electrode lap portion 1070 and the top electrode resonance portion 1071 located in the effective working region. The top electrode lap portion 1070 may be an extension of the top electrode resonance portion, and both the top electrode lap portion 1070 and the top electrode resonance portion 1071 may be located in a same plane.

Figure 9:
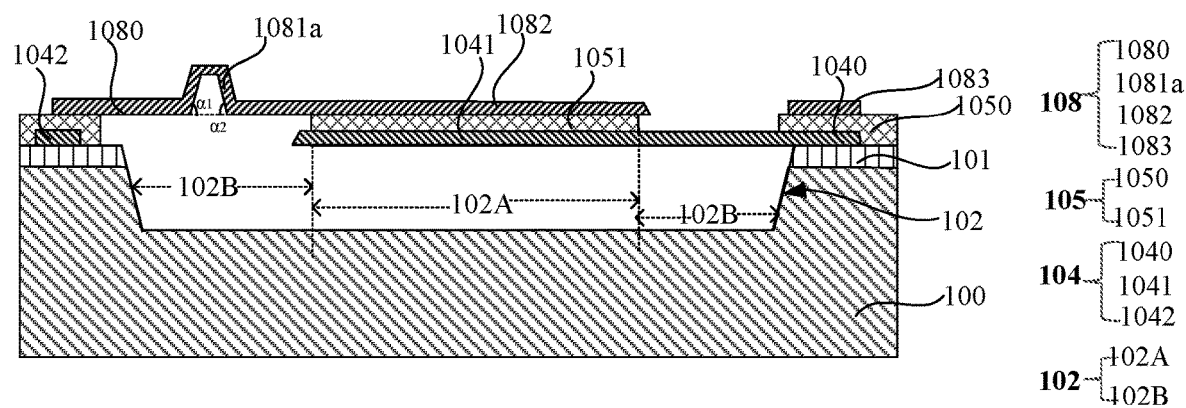
FIG. 9 illustrates a schematic cross-sectional view of another exemplary bulk acoustic wave resonator consistent with various disclosed embodiments of the present disclosure.
Figure 10:
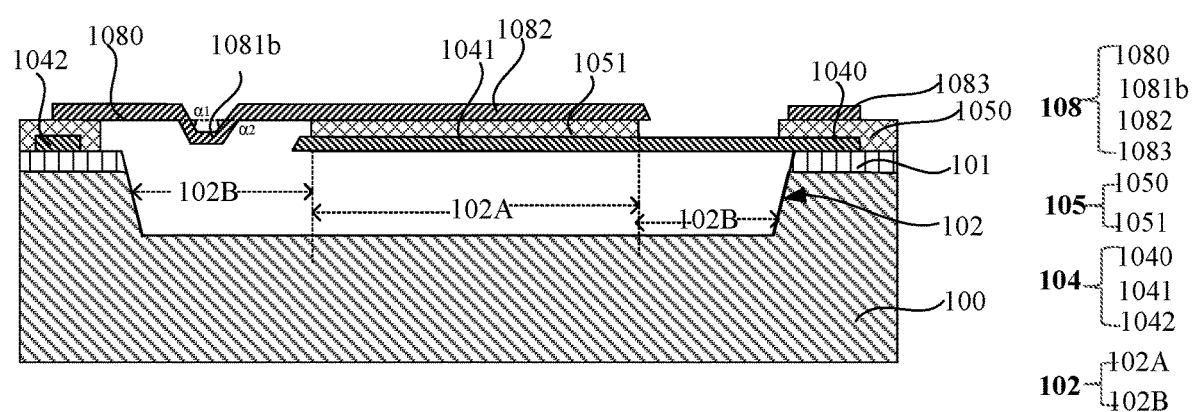
FIG. 10 illustrates a schematic cross-sectional view of another exemplary bulk acoustic wave resonator consistent with various disclosed embodiments of the present disclosure.

Referring to FIG. 9, the top electrode layer 108 may include the top electrode convex portion 1081a, and a portion of the bottom electrode layer 104 over the cavity 102 may be extended flat. Referring to FIG. 10, the top electrode layer 108 may include the top electrode concave portion 1081b, and the portion of the bottom electrode layer 104 over the cavity 102 may be extended flat. The bottom electrode layer 104 may include the bottom electrode lap portion 1040 and the bottom electrode resonance portion 1041 that are connected in sequence. The portion of the bottom electrode layer 104 over the cavity 102 may be extended flat, the bottom electrode lap portion 1040 may be an extension of the bottom electrode resonance portion, and both the bottom electrode lap portion 1040 and the bottom electrode resonance portion 1041 may be located in a same plane. The structure and positional relationship of the protrusions or depressions of the top electrode layer or the bottom electrode layer may be analogous to corresponding descriptions in the foregoing embodiments.

In the structure of the bulk acoustic wave resonator shown in FIGS. 3-10, the cavity may be located in the substrate. The structure of the bulk acoustic wave resonator shown in FIGS. 3-10 may also have a deformed structure in which the cavity is located over the substrate as shown in FIG. 2E.

In addition, most of the parasitic transverse waves of the bulk acoustic wave resonator may be transmitted through the connection structure between the film layers over the effective working region 102A and the substrate at the periphery of the cavity. Therefore, in the various embodiments of the present disclosure, under the premise of effectively supporting the film layers of the effective working region 102A, the area (or line width) of the top electrode lap portion 1080 may be minimized, and the area (or line width) of the bottom electrode lap portion 1040 may be minimized.

The present disclosure also provides a fabrication method of a bulk acoustic wave resonator. The method may include providing a substrate, and forming a first sacrificial layer on a portion of the substrate. An edge portion of the first sacrificial layer may include a depression or a protrusion. The method may also include forming a bottom electrode layer over the substrate and the first sacrificial layer. The bottom electrode layer may cover the edge portion of the first sacrificial layer, to form a bottom electrode concave portion or a bottom electrode convex portion. Moreover, the method may include forming a piezoelectric resonance layer on the bottom electrode layer. The piezoelectric resonance layer may expose the bottom electrode concave portion or the bottom electrode convex portion. In addition, the method may include forming a second sacrificial layer in the exposed region around the piezoelectric resonance layer, and forming a top electrode layer on the piezoelectric resonance layer and a portion of the second sacrificial layer around the piezoelectric resonance layer. The second sacrificial layer may be coplanar with the top surface of the piezoelectric resonance layer. Alternatively, the second sacrificial layer may include a depression or a protrusion, and the top electrode layer may cover a portion of the second sacrificial layer to form the top electrode convex portion or the top electrode concave portion.

Further, the method may include removing the second sacrificial layer and the first sacrificial layer, to form a cavity in the positions of the second sacrificial layer and the first sacrificial layer. The bottom electrode concave portion or the bottom electrode convex portion may be located in the cavity region on the periphery of the piezoelectric resonance layer. The portion of the top electrode layer over the cavity may be extended flat. Alternatively, the top electrode convex portion or the top electrode concave portion and the bottom electrode concave portion or the bottom electrode convex portion may be located in the cavity region on the periphery of the piezoelectric resonance layer. The bottom electrode concave portion or the bottom electrode convex portion and the top electrode convex portion or the top electrode concave portion may be extended surrounding the peripheral direction of the piezoelectric resonance layer, and may be at least partially opposite to each other.

Exemplary Embodiment 2

In one embodiment, the structure of the bulk acoustic wave resonator may include the bottom electrode layer 104 having a bottom electrode concave portion 1041b, and the top electrode layer 108 having the top electrode convex portion 1081a. The present disclosure provides a fabrication method of the bulk acoustic wave resonator (e.g., the bulk acoustic wave resonator shown in FIGS. 1A-2D). The method may include following.

S11: providing a substrate, and forming a first sacrificial layer on a portion of the substrate.

S12: forming a first groove in an edge portion of the first sacrificial layer, where the first groove may not expose the surface of the substrate under the first sacrificial layer.

S13: forming a bottom electrode layer over the first sacrificial layer, where the portion of the bottom electrode layer covering the surface of the first groove may form the bottom electrode concave portion.

S14: forming a piezoelectric layer over the bottom electrode layer, where the piezoelectric layer may expose the bottom electrode concave portion.

S15: forming a second sacrificial layer having a second sacrificial protrusion in the exposed region around the piezoelectric layer.

S16: forming a top electrode layer on the piezoelectric layer and a portion of the second sacrificial layer around the piezoelectric layer, where a portion of the top electrode layer covering the second sacrificial protrusion may form the top electrode convex portion.

S17: removing the second sacrificial layer and the first sacrificial layer, to form a cavity in the positions of the second sacrificial layer and the first sacrificial layer.

Figure 11A:
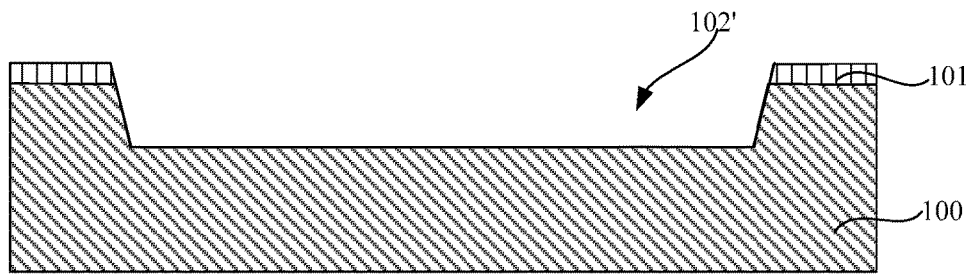
FIGS. 11A-11H illustrate cross-sectional views along a XX' direction in FIG. 1A of semiconductor structures corresponding to certain stages of an exemplary fabrication method of a bulk acoustic wave resonator consistent with various disclosed embodiments of the present disclosure.

Referring to FIGS. 1A-1B and FIGS. 4A-4B, in S11, forming the groove by etching the substrate and forming the first sacrificial layer over a portion of the substrate by filling a material in the groove may include following. Referring to FIG. 1A and FIG. 11A, a substrate may be provided. In one embodiment, a base 100 may be provided, and an etching protection layer 101 may be coated on the base 100. The etching protection layer 101 may be formed on the base 100 by any suitable process method, e.g., thermal oxidation, thermal nitriding, thermal oxy-nitriding, or any other heat treatment method, or a chemical vapor deposition, a physical vapor deposition, an atomic layer deposition, or any other deposition method. Further, the thickness of the etching protection layer 101 may be set reasonably according to actual device process requirements, and may not be limited by the present disclosure.

The substrate may be etched through photolithography and etching processes, to form at least one third groove 102'. The etching process may include a wet etching process or a dry etching process, and the dry etching process may be preferred. The dry etching process may include but may not be limited to a reactive ion etching (RIE), an ion beam etching, a plasma etching, or a laser cutting. The depth and shape of the third groove 102' may be dependent on the depth and shape of the cavity required for the to-be-formed bulk acoustic wave resonator. A cross section of the third groove 102' may have a rectangular shape. In certain embodiments, the cross section of the third groove 102' may have any other suitable shape, e.g., a circle, an ellipse, or any other polygon (e.g., a pentagon, a hexagon, etc.) other than the rectangle.

Figure 11B:
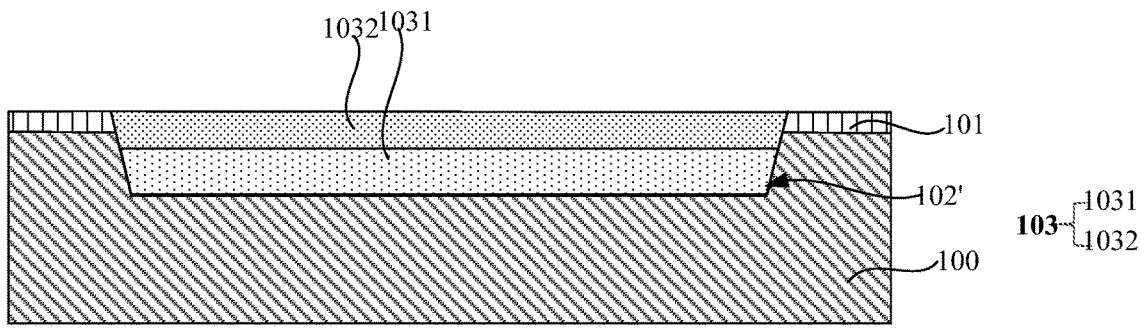

Referring to FIGS. 1A-1B and FIG. 11B, the first sacrificial layer 103 may be formed to fill the third groove 102'. The first sacrificial layer 103 may include a first sub-sacrificial layer 1031 and a second sub-sacrificial layer 1032 that are made of different materials and stacked from bottom to top. The disposure of the first sub-sacrificial layer 1031 and the second sub-sacrificial layer 1032 may enable precise control of the etching stop point when subsequently forming the first groove by etching, and may further enable precise control of the depth of the depression of the subsequently formed bottom electrode concave portion 1041b. Therefore, the thickness of the second sub-sacrificial layer 1032 may determine the depth of the depression of the subsequently formed bottom electrode concave portion 1041b. Two methods may be used to form the first sacrificial layer 103.

On method for forming the first sacrificial layer 103 may include following. Firstly, the first sub-sacrificial layer 1031 may be filled in the third groove 102' by a vapor deposition process or an epitaxial growth process. Then, by chemical mechanical polishing (CMP) process, the top of the first sub-sacrificial layer 1031 may be planarized until the top surface of the etching protection layer 101 is exposed, such that the first sub-sacrificial layer 1031 may merely be located in the third groove 102'. Following, the top of the first sub-sacrificial layer 1031 with a certain thickness may be surface-modified using a suitable surface modification treatment process including at least one of oxidation treatment, nitriding treatment and ion implantation, which may be selected according to the material of the first sub-sacrificial layer 1031, such that the top of the first sub-sacrificial layer 1031 with the certain thickness may be converted into the second sub-sacrificial layer 1032 made of another material. The second sub-sacrificial layer 1032 and the remaining first sub-sacrificial layer 1031 that has not been surface-modified under the second sub-sacrificial layer 1032 may form the first sacrificial layer that fully fills the third groove 102'.

For example, when the base 100 is a Si substrate, the first sub-sacrificial layer 1031 is Ge, and the etching protection layer 101 is silicon oxide, the top of the first sub-sacrificial layer 1031 with a certain thickness may be oxidized in an oxygen atmosphere, to be converted into germanium oxide as the second sub-sacrificial layer 1032. The thickness of the second sub-sacrificial layer 1032 may be dependent on the depth of the depression of the bottom electrode concave portion 1041b. Further, the top of the second sub-sacrificial layer 1032 may be planarized using a chemical mechanical polishing (CMP) process until the top surface of the etching protection layer 101 is exposed, such that the top surface of the first sacrificial layer 103 may be coplanar with the top surface of the surrounding etching protection layer 101, to provide a substantially flat operating surface for subsequent processes.

Another method for forming the first sacrificial layer 103 may include following. First, the material used as the first sub-sacrificial layer may be filled in the third groove 102', and the filled material of the first sub-sacrificial layer may be any material different from the etching protection layer 101 and the base 100 known to those skilled in the art, e.g., amorphous carbon, photoresist, a dielectric material (such as silicon nitride, silicon oxy-carbide, a porous material, etc.), or a semiconductor material (such as polysilicon, amorphous silicon, germanium), etc. Then, the material of the first sub-sacrificial layer may be back-etched using a dry etching process or a wet etching process, such that the top surface of the material of the first sub-sacrificial layer 1031 in the third groove 102' may be lower than the top surface of the base 100, to form the first sub-sacrificial layer 1031. Following, the second sub-sacrificial layer 1032 may be filled in the third groove 102' through a suitable process such as an epitaxial growth process, a thermal oxidation process, a vapor deposition process, or a coating process, etc. The second sub-sacrificial layer 1032 fully filling the third groove 102' may be made of a material different from the first sub-sacrificial layer. The second sub-sacrificial layer 1032 may be made of a dielectric material such as silicon nitride, silicon oxy-nitride, or phosphosilicate glass, etc. The second sub-sacrificial layer 1032 and the first sub-sacrificial layer 1031 under the second sub-sacrificial layer 1032 may form the first sacrificial layer 103 that fully fills the third groove 102'.

Figure 11C:
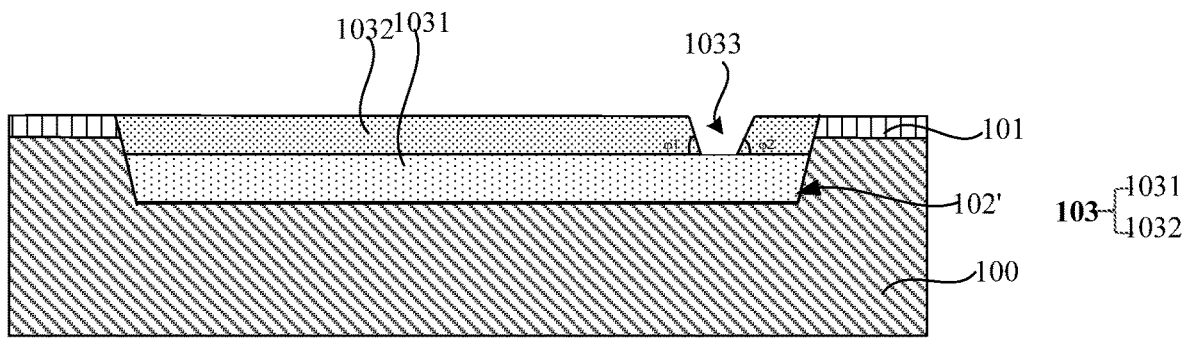

Referring to FIGS. 1A-1B and FIG. 11C, in S12, the second sub-sacrificial layer 1032 of the first sacrificial layer 103 corresponding to the periphery of the effective working region (102A in FIG. 11H) of the to-be-formed bulk acoustic wave resonator may be etched through photolithography and etching processes, to form the first groove 1033. The etching may stop on the top surface of the first sub-sacrificial layer 1031, or may stop in the first sub-sacrificial layer 1031 due to a certain amount of over-etching. The line width, size, shape, and position of the first groove 1033 may determine the line width, size, shape, and position of the bottom electrode concave portion in subsequently formed bottom electrode layer.

In one embodiment, the longitudinal cross-section of the first groove 1033 along XX' in FIG. 1A may have a trapezoidal shape. The angles φ1 and φ2 between the sidewalls of the first groove 1033 and the top surface of the second sub-sacrificial layer 1032 may be less than 45°, which may facilitate the deposition of a subsequent bottom electrode material layer, thereby improving the thickness uniformity of the subsequently formed bottom electrode layer in the region of the third groove 102'. In certain embodiments, the cross-sectional shape of the first groove 1033 may include a spherical cap with a wide upper and a narrow bottom. In other words, the longitudinal cross-section of the first groove 1033 along XX' in FIG. 1A may have a U-shape. The horizontal distance between the first groove 1033 and the effective working region 102A may be preferably the minimum distance allowed by the etching alignment process of the first groove 1033, and the line width of the first groove 1033 may be the minimum line width allowed by the corresponding process.

Figure 11D:
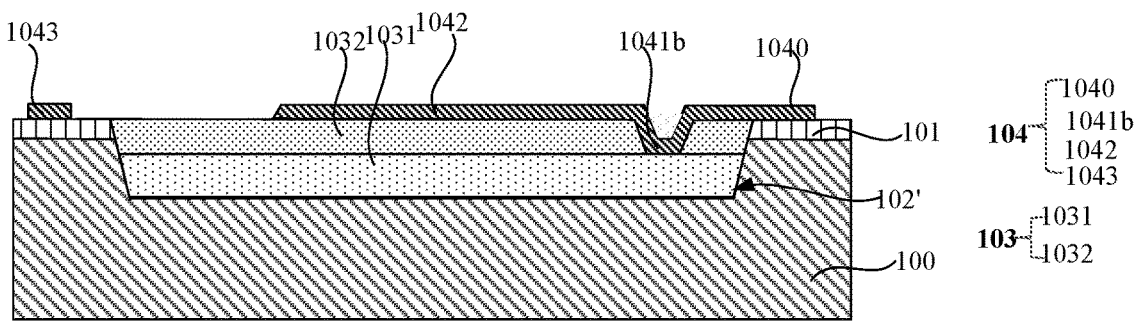

Referring to FIGS. 1A-1B and FIG. 11D, in S13, first, a bottom electrode material layer (not illustrated) may be coated on the surfaces of the etching protection layer 101, the second sub-sacrificial layer 1032, and the first groove 1033 using a suitable method, such as a magnetron sputtering process, a physical vapor deposition process, a chemical vapor deposition process, or any other deposition process, which may be selected according to the material of the to-be-formed bottom electrode layer. Then, a photoresist layer (not illustrated) with a defined bottom electrode layer pattern may be formed on the bottom electrode material layer using a photolithography process, and the bottom electrode layer 104 (i.e., the remaining bottom electrode material layer) may be formed by etching the bottom electrode material layer using the photoresist layer as a mask. Following, the photoresist layer may be removed. The material of the bottom electrode material layer may refer to the foregoing embodiments.

In one embodiment, the bottom electrode layer 104 may include the bottom electrode resonance portion 1042 covering the subsequently formed effective working region 102A, the bottom electrode concave portion 1041*b* covering the first groove 1033, the bottom electrode lap portion 1040, and the bottom electrode peripheral portion 1043. The bottom electrode lap portion 1040 may be extended from one side of the bottom electrode concave portion 1041*b* to a portion of the etching protection layer 101 outside of the third groove 102' through the surface of the second sub-sacrificial layer 1032. The bottom electrode peripheral portion 1043 may be separated from the bottom electrode resonance portion 1042 and the bottom electrode concave portion 1041*b*, and may be connected to the side of the bottom electrode lap portion 1040 facing away from the bottom electrode resonance portion 1042, to serve as a metal contact of the to-be-formed bulk acoustic wave resonator in such region. The bottom electrode peripheral portion 1043 may be separated from the bottom electrode lap portion 1040, to serve as a portion of the bottom electrode lap portion of the adjacent bulk acoustic wave resonator. In certain embodiments, the bottom electrode peripheral portion 1043 may be omitted. The structure of the bottom electrode layer 104 may refer to the corresponding descriptions in foregoing embodiments. The shape, line width of the bottom electrode concave portion 1041*b*, and the horizontal distance between the bottom electrode concave portion 1041*b* and the effective working region 102A may be dependent on the molding process of the first groove 1033.

Figure 11E:
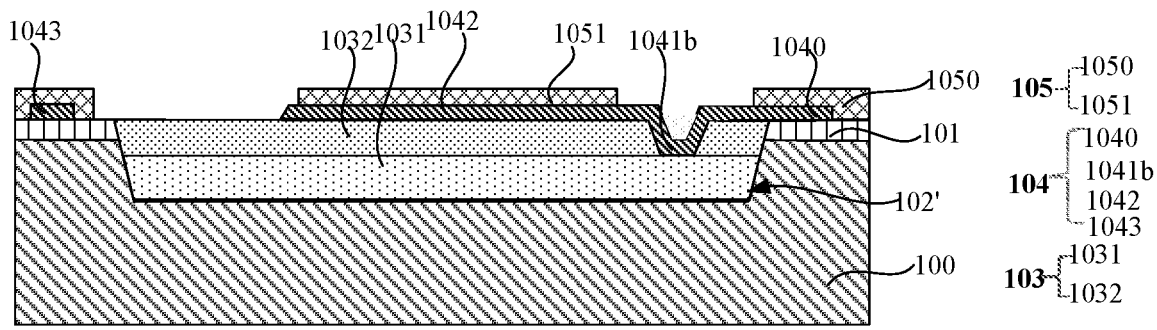

Referring to FIGS. 1A-1B and FIG. 11E, in S14, first, a piezoelectric material layer 105 may be formed by any suitable deposition method such as a chemical vapor deposition process, a physical vapor deposition process, or an atomic layer deposition process. Then, the piezoelectric layer 1051 may be formed by etching the piezoelectric material layer 105 using a patterning process. The piezoelectric material layer 105 may be made of a material including aluminum nitride (AlN), zinc oxide (ZnO), lead zirconate titanate (PZT), lithium niobate (LiNbO$_3$), quartz, potassium niobate (KNbO$_3$), lithium tantalate (LiTaO$_3$), or any other piezoelectric material with wurtzite crystal structure, and a combination thereof.

When the piezoelectric material layer 105 is made of a material including aluminum nitride (AlN), the piezoelectric material layer 105 may be doped with the rare earth metal including at least one of scandium (Sc), erbium (Er), yttrium (Y), and lanthanum (La), or may be doped with the transition metal including at least one of zirconium (Zr), titanium (Ti), manganese (Mn) and hafnium (Hf). The remaining piezoelectric material layer 105 after being patterned may include the piezoelectric layer 1051 and a piezoelectric peripheral portion 1050 that are separated from each other. The piezoelectric layer 1051 may be located on the bottom electrode resonance portion 1042, may expose the bottom electrode concave portion 1041*b*, and may fully cover or partly cover the bottom electrode resonance portion 1042. A gap may be formed between the piezoelectric peripheral portion 1050 and the piezoelectric layer 1051, to expose the bottom electrode concave portion 1041*b* and the second sub-sacrificial layer 1032 around the bottom electrode resonance portion 1042, to further limit a formation region of subsequently formed second sacrificial layer, and at the same time, to provide a substantially flat process surface for the subsequent formation of the second sacrificial protrusion. The piezoelectric peripheral portion 1050 may separate the subsequently formed top electrode peripheral portion and the previously formed bottom electrode peripheral portion 1043, and at the same time, may provide a substantially flat process surface for the subsequent formation of the second sacrificial layer and the top electrode layer.

Figure 11F:
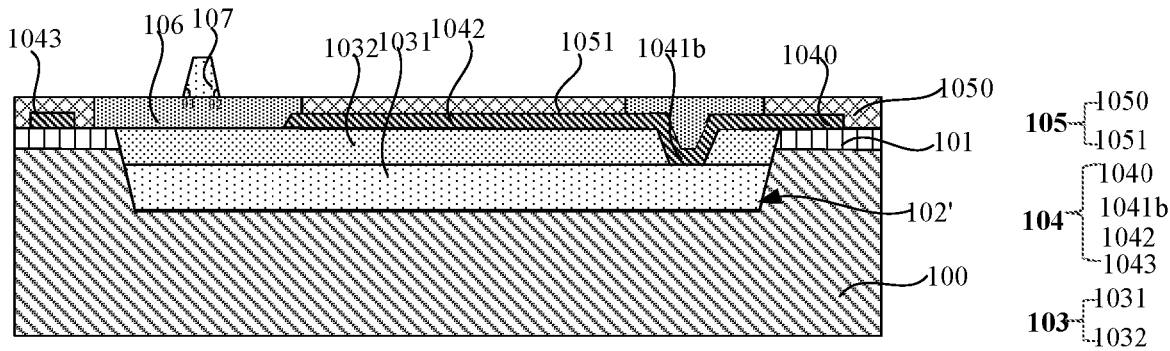

Referring to FIGS. 1A-1B and FIG. 11F, in S15, first, the second sacrificial material layer may be coated on the piezoelectric peripheral portion 1050, the piezoelectric layer 1051, and the gap between the piezoelectric peripheral portion 1050 and the piezoelectric layer 1051 through a suitable process such as a coating process or a vapor deposition process. The material of the second sacrificial material layer may include at least one of amorphous carbon, photoresist, a dielectric material (e.g., silicon nitride, silicon oxy-carbide, a porous material, etc.), and a semiconductor material (e.g., polysilicon, amorphous silicon, germanium), etc. Then, the second sacrificial material layer may be planarized by a CMP process until the surface of the piezoelectric layer 1051 is exposed, to form a second sacrificial layer 106. The second sacrificial layer 106 may be merely filled in the gap between the piezoelectric peripheral portion 1050 and the piezoelectric layer 1051.

In certain embodiments, the second sacrificial layer 106 may be formed by a back-etching process. A sacrificial material layer (not illustrated) may be coated on the piezoelectric peripheral portion 1050, the piezoelectric layer 1051, and the second sacrificial layer 106 through a suitable process such as a coating process, or a vapor deposition process. A thickness of the sacrificial material layer may be dependent on a protrusion height of the second sacrificial protrusion 107, which may be equal to the depth of the first groove 1033 in FIG. 11C. The sacrificial material layer may be made of a material including at least one of amorphous carbon, photoresist, a dielectric material (e.g., silicon nitride, silicon oxy-carbide, a porous material, etc.), and a semiconductor material (e.g., polysilicon, amorphous silicon, germanium), etc. In one embodiment, the sacrificial material layer may be made of a same material as the second sacrificial layer 106, to save cost and to simplify the process.

Following, the sacrificial material layer may be patterned through a photolithography process or combined photolithography and etching processes, to form the second sacrificial protrusion 107. The shape, size, and position of the second sacrificial protrusion 107 may determine the shape, size, and position of the subsequently formed top electrode convex portion. Optionally, the sidewall of the second sacrificial protrusion 107 may be an inclined sidewall that is inclined with respect to the plane where the piezoelectric layer 1051 is located, and the angles θ1 and θ2 between the sidewalls of the second sacrificial protrusion 107 and the top surface of the piezoelectric layer 1051 may be less than or equal to 45°, which may facilitate to subsequently form the top electrode convex portion 1081a, may avoid breakage, and may improve thickness uniformity. Further, the line width of the second sacrificial protrusion 107 may be the minimum line width allowed by the corresponding process, and the horizontal distance between the second sacrificial protrusion 107 and the piezoelectric layer 1051 may be the minimum distance allowed by the corresponding process. Therefore, the device size may be reduced while effectively blocking the transverse waves. In certain embodiments, the second sacrificial protrusion 107 and the second sacrificial layer 106 may be formed by a same process.

Figure 11G:
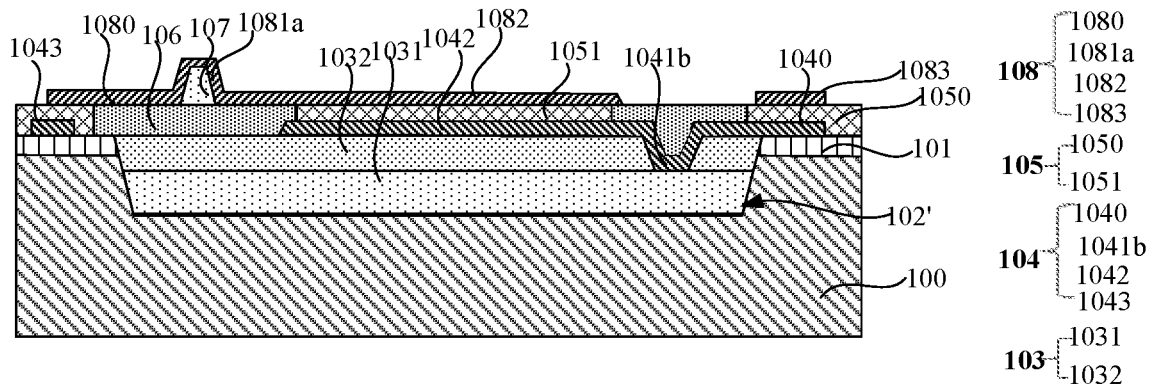

Referring to FIGS. 1A-1B and FIG. 11G, in S16, first, a top electrode material layer (not illustrated) may be coated on the surfaces of the piezoelectric peripheral portion 1050, the piezoelectric layer 1051, the second sacrificial layer 106, and the second sacrificial protrusion 107. For example, the top electrode material layer may be formed by a magnetron sputtering process, or a vapor deposition process such as a physical vapor deposition process or a chemical vapor deposition process, etc. The thickness of the top electrode material layer may be uniform at each position. Then, the top electrode material layer may be patterned, to form the top electrode layer 108 (i.e., the patterned top electrode material layer or the remaining top electrode material layer). The material of the top electrode material layer may refer to corresponding descriptions in the foregoing embodiments.

In one embodiment, the top electrode layer 108 may include the top electrode resonance portion 1082 covering the piezoelectric layer 1051, the top electrode convex portion 1081a covering the second sacrificial protrusion 107, the top electrode lap portion 1080, and the top electrode peripheral portion 1083. The top electrode lap portion 1080 may be extended from one side of the top electrode convex portion 1081a to the piezoelectric peripheral portion 1050 outside of the top electrode convex portion 1081a through a portion of the top surface of the second sacrificial layer 106. The top electrode peripheral portion 1083 may be separated from the top electrode resonance portion 1082 and the top electrode convex portion 1081a, and may be connected to the side of the top electrode lap portion 1080 facing away from the top electrode resonance portion 1082, to serve as a metal contact of the to-be-formed bulk acoustic wave resonator in such region. The top electrode peripheral portion 1083 may be separated from the top electrode lap portion 1080, to serve as a portion of the top electrode lap portion of the adjacent bulk acoustic wave resonator. In certain embodiments, the top electrode peripheral portion 1083 may be omitted. The structure of the top electrode layer may refer to corresponding descriptions in foregoing embodiments.

The top electrode lap portion 1080 may be electrically connected to the side of the top electrode convex portion 1081a facing away from the top electrode resonance portion 1082, and may be extended from the top electrode convex portion 1081a to a portion of the top surface of the etching protection layer 101 outside of the third groove 102' through a portion of the top surface of the second sacrificial layer 106. The top electrode lap portion 1080 and the bottom electrode lap portion 1040 may be staggered (in other words, the top electrode lap portion 1080 and the bottom electrode lap portion 1040 may not overlap in the region of the cavity 102), and the top electrode lap portion 1080 and the bottom electrode lap portion 1040 may expose at least one edge of the third groove 102', respectively.

Figure 11H:
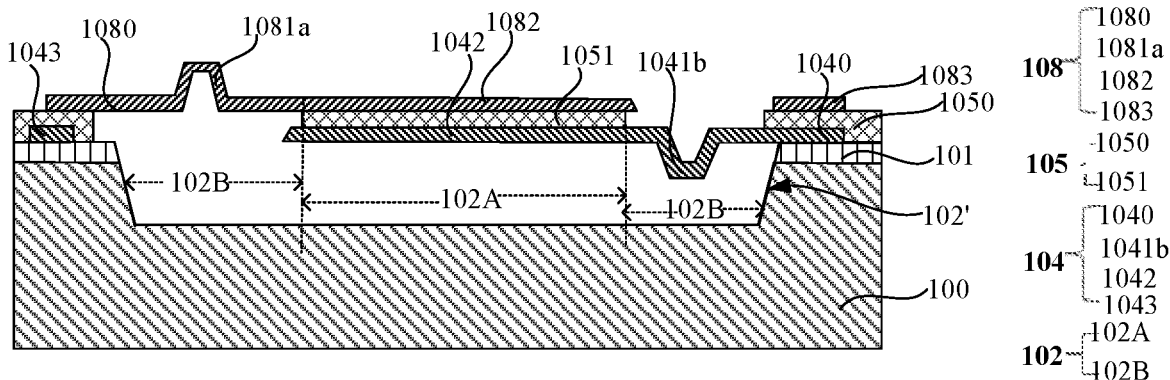

Referring to FIGS. 1A-1B and FIG. 11H, in S17, at least one release hole (not illustrated) may be formed by perforating the edge of the piezoelectric peripheral portion 1050 facing towards the third groove 102' or the periphery of the device region of the bulk acoustic wave resonator through the combined photolithography and etching processes or a laser cutting process. Then, gas and/or liquid medicine may be injected into the release hole to remove the second sacrificial protrusion 107, the second sacrificial layer 106 and the first sacrificial layer 103, thereby emptying the third groove again to form the cavity 102. The cavity 102 may include the space of the third groove 102' limited by the bottom electrode concave portion 1041b, the space increased by the top electrode convex portion 1081a, and the space originally occupied by the second sacrificial layer 106 under the top electrode convex portion 1081a.

It should be noted that step S17 may be performed after all the film layers over the to-be-formed cavity have been formed. Therefore, the first sacrificial layer 103 and the second sacrificial layer 106 may continue to protect the space of the cavity 102 and the stacked film structure from the bottom electrode layer 104 to the top electrode layer 108 formed over the cavity, and to prevent the cavity from being collapsed due to the subsequent process after forming the cavity 102. In addition, the release hole formed in S17 may be retained, and the release hole may be sealed by a subsequent packaging process such as a two-substrate bonding, such that the cavity 102 may be sealed.

The bulk acoustic wave resonator in the present disclosure may be formed by the disclosed fabrication method of the bulk acoustic wave resonator. The bottom electrode lap portion, the bottom electrode concave portion, and the bottom electrode resonance portion may be formed in a single process, and the top electrode lap portion, the top electrode convex portion, and the top electrode resonance portion may be formed in a single process, thereby simplifying the process and reducing the manufacturing cost.

In the bulk acoustic wave resonator formed by the fabrication method in the foregoing embodiments, the bottom electrode layer 104 may include the bottom electrode concave portion 1041b, and the top electrode layer 108 may include the top electrode convex portion 1081a.

Exemplary Embodiment 3

Figure 3:
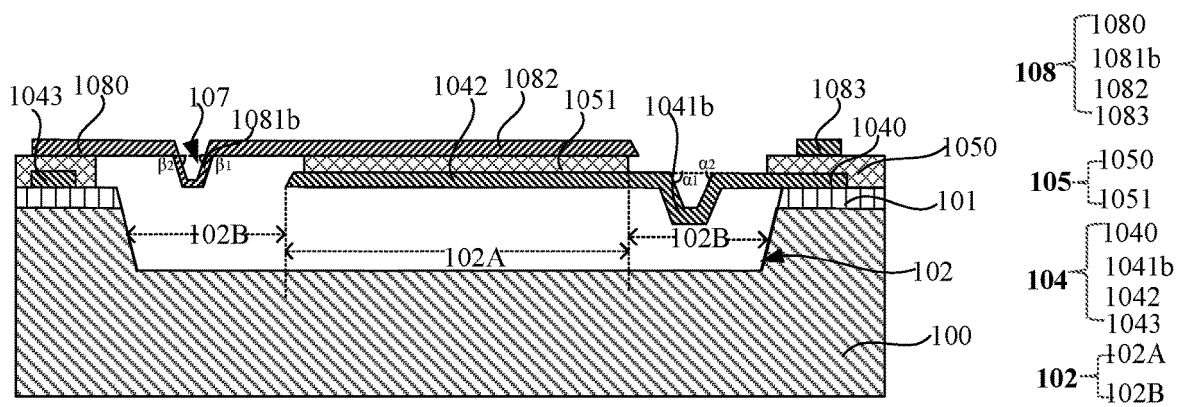
FIG. 3 illustrates a schematic cross-sectional view of another exemplary bulk acoustic wave resonator consistent with various disclosed embodiments of the present disclosure.

The present disclosure also provides a fabrication method of the bulk acoustic wave resonator (e.g., the bulk acoustic wave resonator illustrated in FIG. 3). The method may include following.

S21: providing a substrate, and forming a first sacrificial layer on a portion of the substrate.

S22: forming a first groove in an edge portion of the first sacrificial layer, where the first groove may not expose the surface of the substrate under the first sacrificial layer.

S23: forming a bottom electrode layer over the first sacrificial layer, where the portion of the bottom electrode layer covering the surface of the first groove may form the bottom electrode concave portion.

S24: forming a piezoelectric layer over the bottom electrode layer, where the piezoelectric layer may expose the bottom electrode concave portion.

S25: forming a second sacrificial layer in the exposed region around the piezoelectric layer, and forming a second groove in the second sacrificial layer.

S26: forming a top electrode layer on the piezoelectric layer and a portion of the second sacrificial layer around the piezoelectric layer, where a portion of the top electrode layer covering the second groove may form the top electrode concave portion.

S27: removing the second sacrificial layer and the first sacrificial layer, to form a cavity in the positions of the second sacrificial layer and the first sacrificial layer.

The steps in embodiment 3 may be basically the same as the steps in embodiment 2, and the difference may include that in S25, the second groove may be formed in the second sacrificial layer, and in S26, the top electrode concave portion may be formed in the second groove. Steps S21-S24 may refer to corresponding descriptions associated with FIGS. 11A-11E.

Figure 12A:
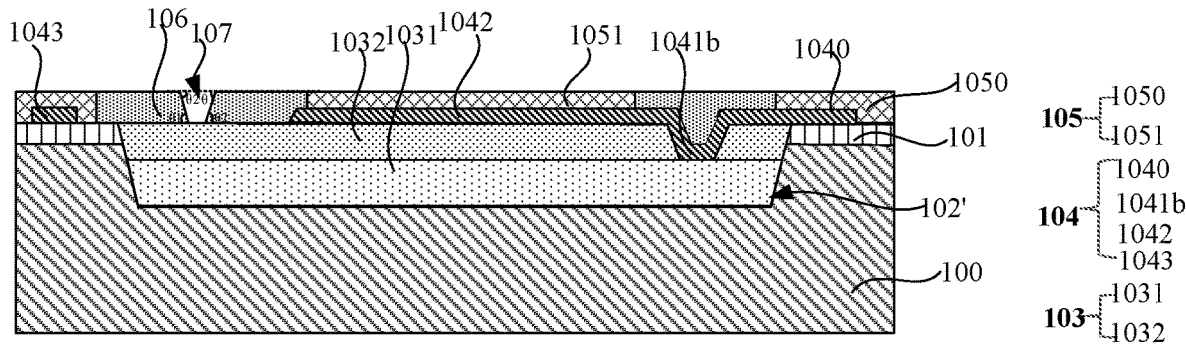
FIGS. 12A-12C illustrate cross-sectional views along a XX' direction in FIG. 1A of semiconductor structures corresponding to certain stages of another exemplary fabrication method of a bulk acoustic wave resonator consistent with various disclosed embodiments of the present disclosure.

Referring to FIG. 3 and FIG. 12A, in S25, first, the second sacrificial layer may be formed, and the second sacrificial layer 106 may fully fill the gap between the piezoelectric peripheral portion 1050 and the piezoelectric layer 1051. Then, the second sacrificial layer 106 may be patterned through a photolithography process or combined photolithography and etching processes, to form the second groove 107. The shape, size, and position of the second groove 107 may determine the shape, size, and position of the top electrode concave portion. Optionally, the sidewall of the second groove 107 may be an inclined sidewall that is inclined with respect to the plane where the piezoelectric layer 1051 is located, and the angles θ1 and θ2 between the sidewalls of the second groove 107 and the top surface of the piezoelectric layer 1051 may be less than or equal to 45°, which may facilitate to subsequently form the top electrode concave portion 1081b, may avoid breakage, and may improve thickness uniformity. Further, the line width of the second groove 107 may be the minimum line width allowed by the corresponding process, and the horizontal distance between the second groove 107 and the piezoelectric layer 1051 may be the minimum distance allowed by the corresponding process.

In certain embodiments, when the second groove 107 and the first groove 103 do not overlap in the vertical direction, after etching the second sacrificial layer 106, there may be a certain amount of over-etching, such that the bottom surface of the formed second groove 107 may stop within a certain thickness of the first sacrificial layer 103. For example, the bottom of the second groove 107 may reach the top surface of the first sub-sacrificial layer 1031, such that the subsequently formed top electrode concave portion 1081b may complement the edge portion of the bottom electrode concave portion 1041b that does not surround the piezoelectric layer 1051, and the combination of the top electrode concave portion 1081b and the bottom electrode concave portion 1041b may circle the piezoelectric layer 1051. In certain embodiments, forming the second sacrificial layer 106 and the second groove 107 may refer to the method of forming the first sacrificial layer 103 and the first groove 1033 in steps S11-S12, which may not be repeated herein.

Figure 12B:
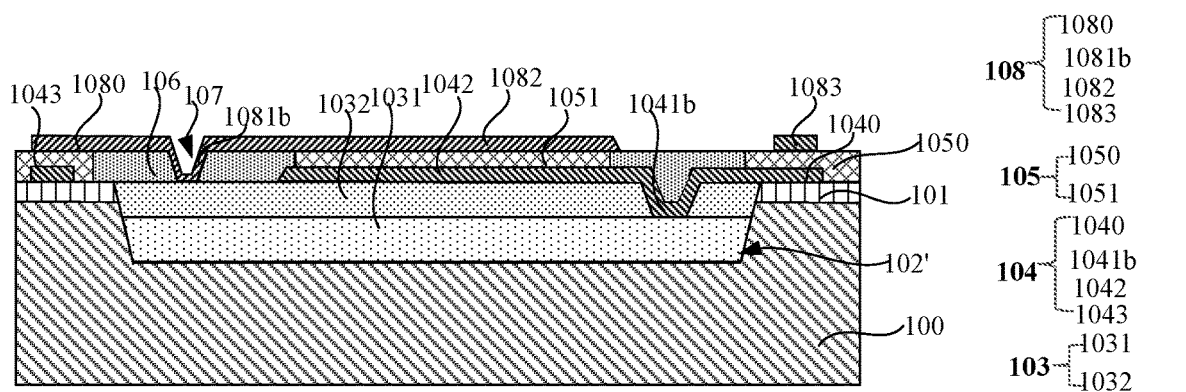

Referring to FIG. 12B, in S26, first, a top electrode material layer (not illustrated) may be coated on the surfaces of the piezoelectric peripheral portion 1050, the piezoelectric layer 1051, the second sacrificial layer 106, and the second groove 107. Then, the top electrode material layer may be patterned, to form the top electrode layer 108 (i.e., the patterned top electrode material layer or the remaining top electrode material layer). In one embodiment, the top electrode layer 108 may include the top electrode resonance portion 1082 covering the piezoelectric layer 1051, the top electrode concave portion 1081b covering the second groove 107, the top electrode lap portion 1080, and the top electrode peripheral portion 1083. The top electrode lap portion 1080 may be extended from the top electrode concave portion 1081b to the piezoelectric peripheral portion 1050 outside of the top electrode concave portion 1081b through a portion of the top surface of the second sacrificial layer 106. The top electrode peripheral portion 1083 may be separated from the top electrode resonance portion 1082 and the top electrode concave portion 1081b.

Figure 12C:
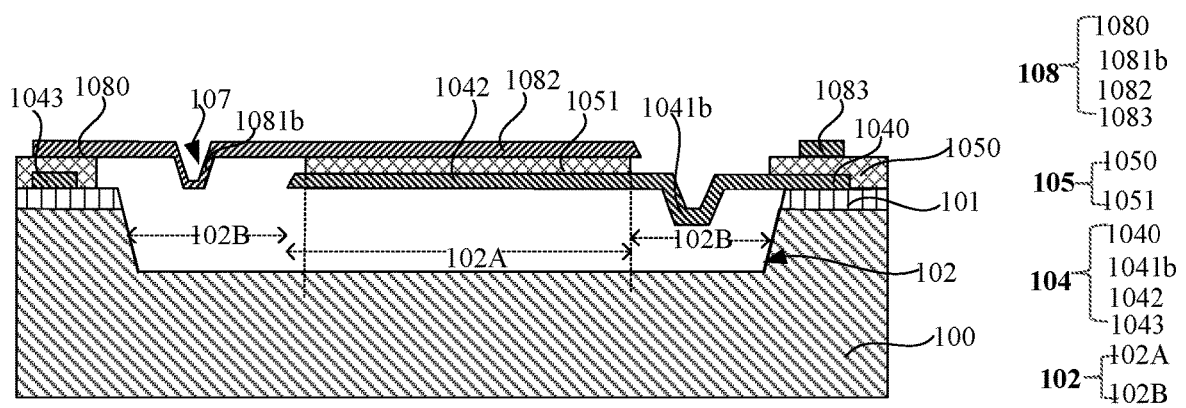

Referring to FIG. 12C, in S27, using the method in S17, the second sacrificial layer 106 and the first sacrificial layer 103 may be removed, thereby emptying the third groove again to form the cavity 102. The cavity 102 may include the space of the third groove 102' limited by the bottom electrode concave portion 1041b, the space increased by the top electrode concave portion 1081b, and the space originally occupied by the second sacrificial layer 106 under the top electrode concave portion 1081b.

In the bulk acoustic wave resonator formed by the fabrication method in the foregoing embodiments, the bottom electrode layer 104 may include the bottom electrode concave portion 1041b, and the top electrode layer 108 may include the top electrode concave portion 1081b.

Exemplary Embodiment 4

The present disclosure also provides a fabrication method of the bulk acoustic wave resonator (e.g., the bulk acoustic wave resonator illustrated in FIG. 7). The method may include following.

S31: providing a substrate, and forming a first sacrificial layer on a portion of the substrate.

S32: forming a first groove in an edge portion of the first sacrificial layer, where the first groove may not expose the surface of the substrate under the first sacrificial layer.

S33: forming a bottom electrode layer over the first sacrificial layer, where the portion of the bottom electrode layer covering the surface of the first groove may form the bottom electrode concave portion.

S34: forming a piezoelectric layer over the bottom electrode layer, where the piezoelectric layer may expose the bottom electrode concave portion.

S35: forming a second sacrificial layer in the exposed region around the piezoelectric layer, where the top surface of the second sacrificial layer may be coplanar with the top surface of the piezoelectric layer.

S36: forming a top electrode layer on the piezoelectric layer and a portion of the second sacrificial layer around the piezoelectric layer, where the top electrode layer may be extended flat on the piezoelectric layer and the second sacrificial layer.

S37: removing the second sacrificial layer and the first sacrificial layer, to form a cavity in the positions of the second sacrificial layer and the first sacrificial layer. The bottom electrode concave portion may be located in the cavity region on the periphery of the piezoelectric layer, and a portion of the top electrode layer over the cavity may be extended flat.

The steps in embodiment 4 may be basically the same as the steps in embodiment 2, and the difference may include that in S36, the top electrode layer may be extended flat on the piezoelectric layer and the second sacrificial layer. Steps S31-S34 may refer to corresponding descriptions associated with FIGS. 11A-11E.

Figure 13A:
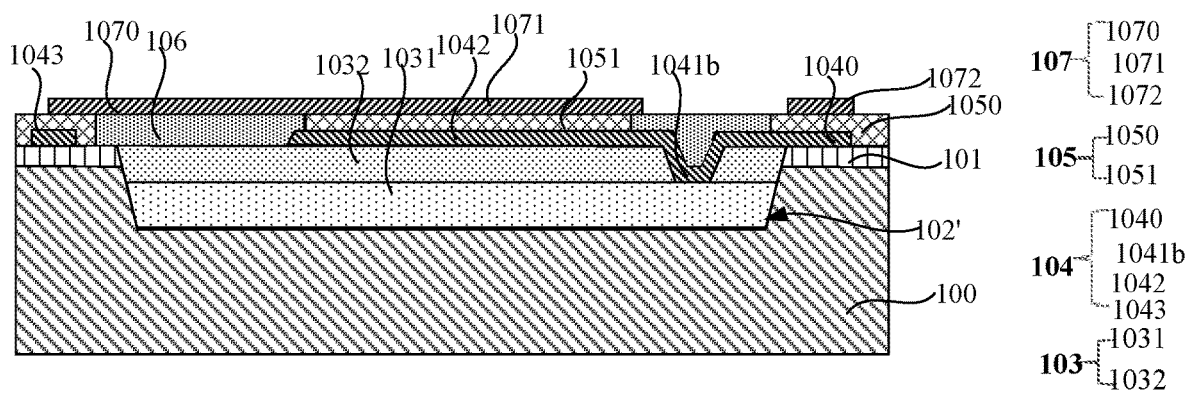
FIGS. 13A-13B illustrate cross-sectional views along a XX' direction in FIG. 1A of semiconductor structures corresponding to certain stages of another exemplary fabrication method of a bulk acoustic wave resonator consistent with various disclosed embodiments of the present disclosure.

Referring to FIG. 13A, in S35, the second sacrificial layer may be formed, and the second sacrificial layer 106 may fully fill the gap between the piezoelectric peripheral portion 1050 and the piezoelectric layer 1051. The top surfaces of the piezoelectric peripheral portion 1050, the piezoelectric layer 1051, and the second sacrificial layer 106 may be flush.

Referring to FIG. 13A, in S36, first, a top electrode material layer (not illustrated) may be formed on the surfaces of the piezoelectric peripheral portion 1050, the piezoelectric layer 1051 and the second sacrificial layer 106. Then, the top electrode material layer may be patterned, to form the top electrode layer 107. In one embodiment, the top electrode layer 107 may include the top electrode resonance portion 1071 covering the piezoelectric layer 1051, the top electrode lap portion 1070, and the top electrode peripheral portion 1072 separated from the top electrode resonance portion 1071. The top electrode lap portion 1070 may be extended from one side of the top electrode resonance portion 1071 to the piezoelectric peripheral portion 1050 outside of the second sacrificial layer 106 through a portion of the top surface of the second sacrificial layer 106.

Figure 13B:
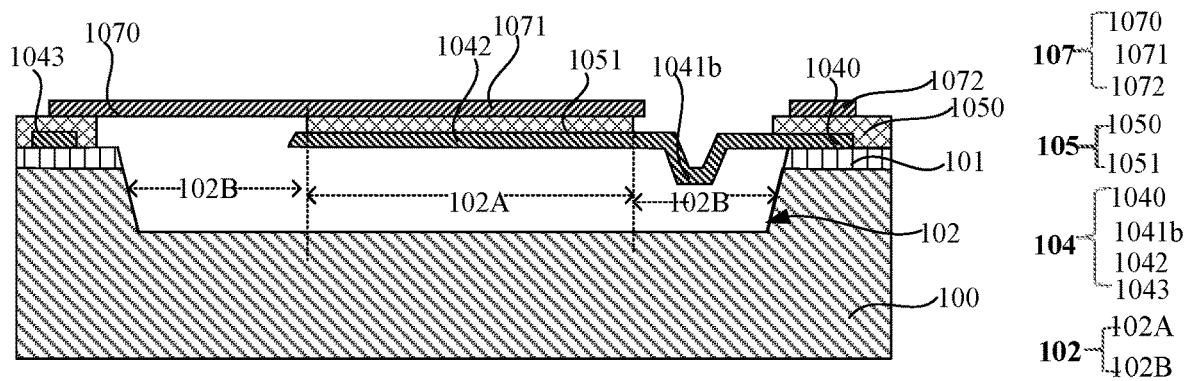

Referring to FIG. 13B, in S37, the second sacrificial layer and the first sacrificial layer may be removed, thereby forming the cavity 102 in the positions of the second sacrificial layer and the first sacrificial layer. The bottom electrode concave portion may be located in the cavity region on the periphery of the piezoelectric layer, and the portion of the top electrode layer above the cavity may be extended flat. The process of removing the second sacrificial layer and the first sacrificial layer may refer to the corresponding descriptions in foregoing embodiments.

In the bulk acoustic wave resonator formed by the fabrication method in the foregoing embodiments, the bottom electrode layer 104 may include the bottom electrode concave portion 1041b, and the portion of the top electrode layer 107 located above the cavity 102 may be extended flat.

Exemplary Embodiment 5

The present disclosure also provides a fabrication method of the bulk acoustic wave resonator (e.g., the bulk acoustic wave resonator illustrated in FIG. 4). The method may include following.

S41: providing a substrate, and forming a first sacrificial layer on a portion of the substrate.

S42: forming a first sacrificial protrusion on an edge portion of the first sacrificial layer.

S43: forming a bottom electrode layer over the first sacrificial layer and the first sacrificial protrusion, where the portion of the bottom electrode layer covering the surface of the first sacrificial protrusion may form the bottom electrode convex portion.

S44: forming a piezoelectric layer over the bottom electrode layer, where the piezoelectric layer may expose the bottom electrode convex portion.

S45: forming a second sacrificial layer having a second sacrificial protrusion in the exposed region around the piezoelectric layer.

S46: forming a top electrode layer on the piezoelectric layer and a portion of the second sacrificial layer around the piezoelectric layer, where a portion of the top electrode layer covering the second sacrificial protrusion may form the top electrode convex portion.

S47: removing the second sacrificial layer having the second sacrificial protrusion and the first sacrificial layer having the first sacrificial protrusion, to form a cavity in the positions of the second sacrificial layer having the second sacrificial protrusion and the first sacrificial layer having the first sacrificial protrusion. Both the top electrode convex portion and the bottom electrode convex portion may be located in the cavity region on the periphery of the piezoelectric layer, and the bottom electrode convex portion and the top electrode convex portion may be extended around the peripheral direction of the piezoelectric layer, and may be at least partially opposite to each other.

The steps in embodiment 5 may be basically the same as the steps in embodiment 2, and the difference may include that in S42, the first sacrificial protrusion may be formed on the first sacrificial layer, and in S43, the bottom electrode convex portion may be formed on the surface of the first sacrificial protrusion.

Figure 14A:
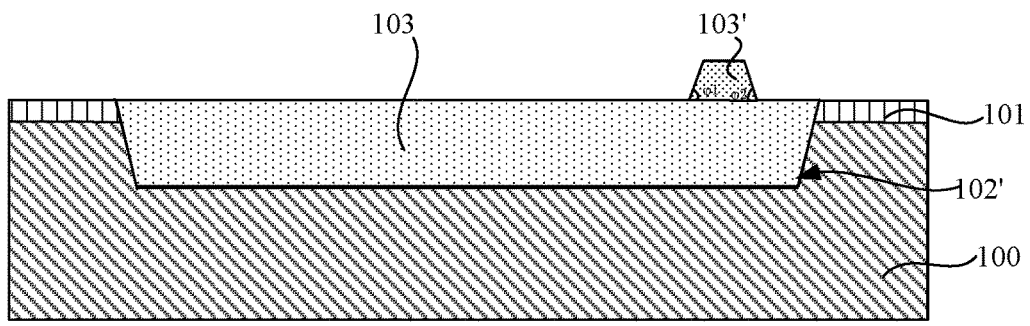
FIGS. 14A-14E illustrate cross-sectional views along a XX' direction in FIG. 1A of semiconductor structures corresponding to certain stages of another exemplary fabrication method of a bulk acoustic wave resonator consistent with various disclosed embodiments of the present disclosure.

Referring to FIG. 14A, in S41 and S42, forming the groove by etching the substrate and forming the first sacrificial layer over a portion of the substrate by filling a material in the groove may include following. A substrate may be provided. In one embodiment, the substrate may include a base 100, and an etching protection layer 101 covering the base 100. The substrate may be etched to form at least one third groove 102'. The first sacrificial layer 103 may be formed in the third groove 102'. The top surface of the first sacrificial layer 103 may be coplanar with the top surface of the surrounding etching protecting layer 101, which may provide a flat process surface for subsequently processes. Following, a sacrificial material layer (not illustrated) may be coated on the first sacrificial layer 103 by any suitable process such as a coating process or a vapor deposition process. The thickness of the sacrificial material layer may be dependent on the protrusion height of the subsequently formed bottom electrode convex portion. The sacrificial material layer may be patterned to form the first sacrificial protrusion 103'. The features of the first sacrificial protrusion 103' may refer to the features of the second sacrificial protrusion in foregoing embodiments. In certain embodiments, the first sacrificial protrusion 103' and the first sacrificial layer 103 may be formed by a single process.

Figure 14B:
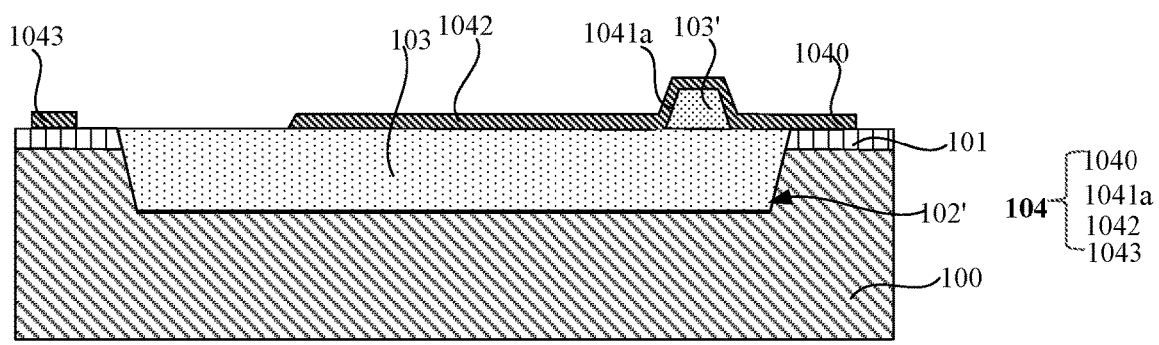

Referring to FIG. 14B, in S43, a bottom electrode material layer (not illustrated) may be coated on the surfaces of the etching protection layer 101, the first sacrificial layer 103, and the first sacrificial protrusion 103'. Then, the bottom electrode layer 104 (i.e., the remaining bottom electrode material layer) may be formed by patterning the bottom electrode material layer. In one embodiment, the bottom electrode layer 104 may include the bottom electrode resonance portion 1042 covering the subsequently formed effective working region 102A, the bottom electrode convex portion 1041a covering the first sacrificial protrusion 103', the bottom electrode lap portion 1040, and the bottom electrode peripheral portion 1043. The bottom electrode lap portion 1040 may be extended from one side of the bottom electrode convex portion 1041a to a portion of the etching protection layer 101 outside of the groove 102' through the surface of the first sacrificial layer 103. The bottom electrode peripheral portion 1043 may be separated from the bottom electrode resonance portion 1042 and the bottom electrode convex portion 1041a.

Figure 14C:
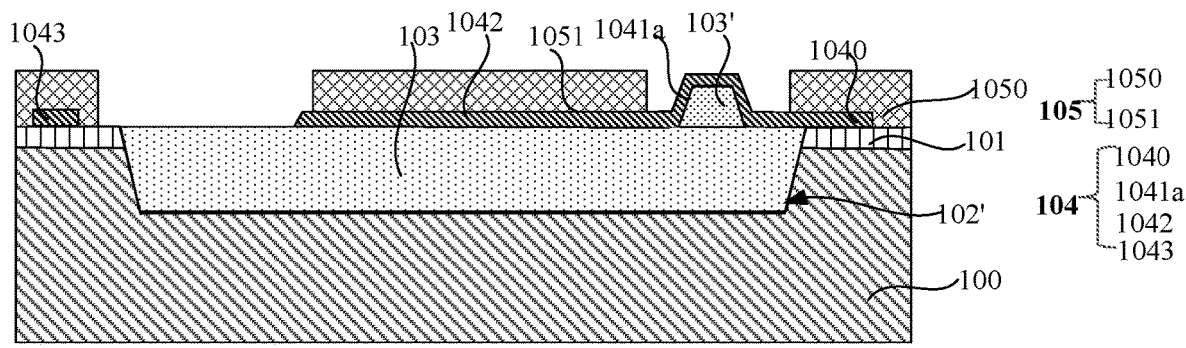

Referring to FIG. 14C, in S44, according to S14, the piezoelectric layer 1051 may be formed on the bottom electrode layer 104, and the piezoelectric layer 1051 may expose the bottom electrode convex portion 1041a.

Figure 14D:
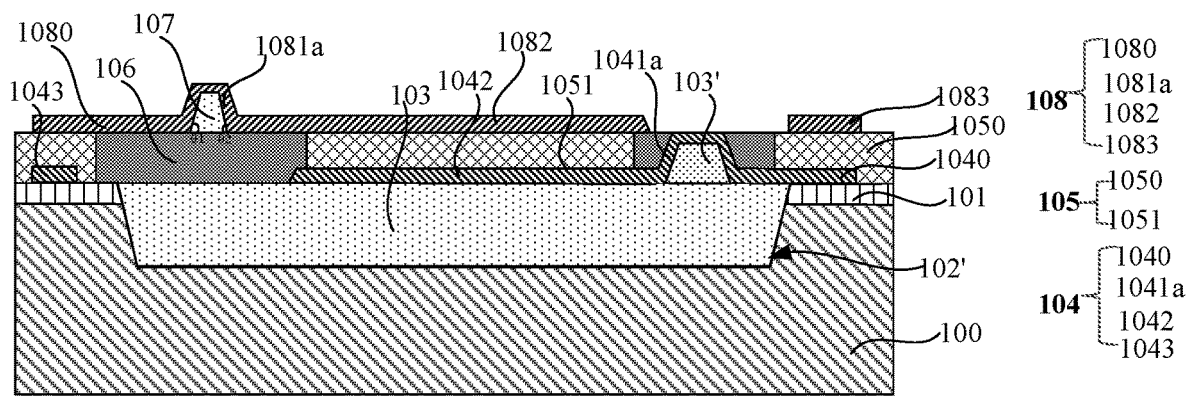

Referring to FIG. 14D, in S45-S46, according to S15-S16, the second sacrificial layer 106 and the second sacrificial protrusion 107 on the second sacrificial layer 106 may be formed in the exposed region around the piezoelectric layer 105. The top electrode layer 108 may be formed on the piezoelectric layer 1051, a portion of the second sacrificial layer 106 and the second sacrificial protrusion 107 around the piezoelectric layer 1051. The portion of the top electrode layer 108 covering the second sacrificial protrusion 107 may form the top electrode convex portion 1081a.

Figure 14E:
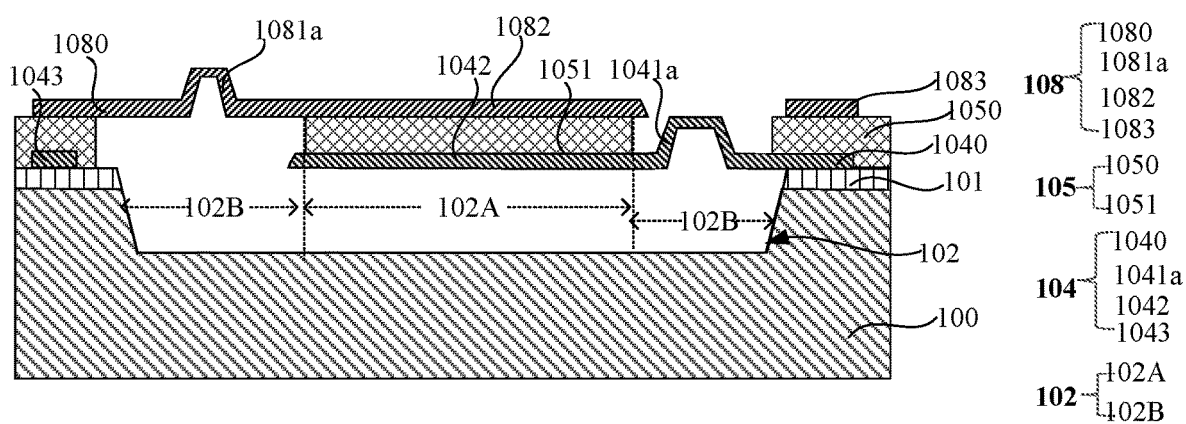

Referring to FIG. 14E, in S47, the second sacrificial protrusion 107, the first sacrificial protrusion 103', the second sacrificial layer 106 and the first sacrificial layer 103 may be removed, thereby emptying the groove again to form the cavity 102. The cavity 102 may include the space of the groove 102' increased by the bottom electrode convex portion 1041a, the space increased by the top electrode convex portion 1081a, and the space originally occupied by the second sacrificial layer 106 under the top electrode convex portion 1081a.

In the bulk acoustic wave resonator formed by the fabrication method in the foregoing embodiments, the bottom electrode layer 104 may include the bottom electrode convex portion 1041a, and the top electrode layer 108 may include the top electrode convex portion 1081a.

Exemplary Embodiment 6

The present disclosure also provides a fabrication method of the bulk acoustic wave resonator (e.g., the bulk acoustic wave resonator illustrated in FIGS. 5-6). The method may include following.

S51: providing a substrate, and forming a first sacrificial layer on a portion of the substrate.

S52: forming a first sacrificial protrusion on an edge portion of the first sacrificial layer.

S53: forming a bottom electrode layer over the first sacrificial layer and the first sacrificial protrusion, where the portion of the bottom electrode layer covering the surface of the first sacrificial protrusion may form the bottom electrode convex portion.

S54: forming a piezoelectric layer over the bottom electrode layer, where the piezoelectric layer may expose the bottom electrode convex portion.

S55: forming a second sacrificial layer having a first groove in the exposed region around the piezoelectric layer.

S56: forming a top electrode layer on the piezoelectric layer and a portion of the second sacrificial layer around the piezoelectric layer, where a portion of the top electrode layer covering the first groove may form the top electrode concave portion.

S57: removing the second sacrificial layer and the first sacrificial layer having the first sacrificial protrusion, to form a cavity in the positions of the second sacrificial layer and the first sacrificial layer having the first sacrificial protrusion.

The steps S51-S54 in embodiment 6 may be basically the same as the steps S41-S44 in embodiment 5, and details may refer to corresponding descriptions associated with FIGS. 14A-14C.

Figure 15A:
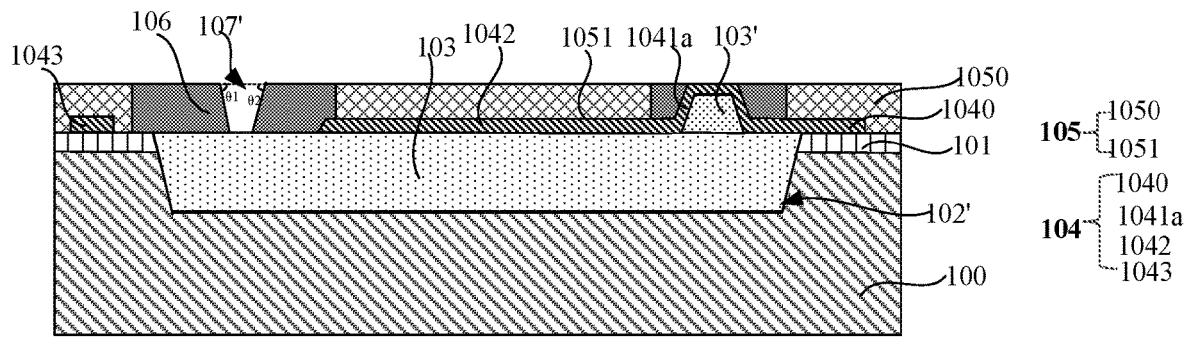
FIGS. 15A-15C illustrate cross-sectional views along a XX' direction in FIG. 1A of semiconductor structures corresponding to certain stages of another exemplary fabrication method of a bulk acoustic wave resonator consistent with various disclosed embodiments of the present disclosure.

Referring to FIG. 15A, in S55, the second sacrificial layer 106 may be formed, and the second sacrificial layer 106 may fully fill the gap between the piezoelectric peripheral portion 1050 and the piezoelectric layer 1051. Then, the second sacrificial layer 106 may be patterned through a photolithography process or combined photolithography and etching processes, to form the second groove 107'. The details may refer to corresponding descriptions in S25.

Figure 15B:
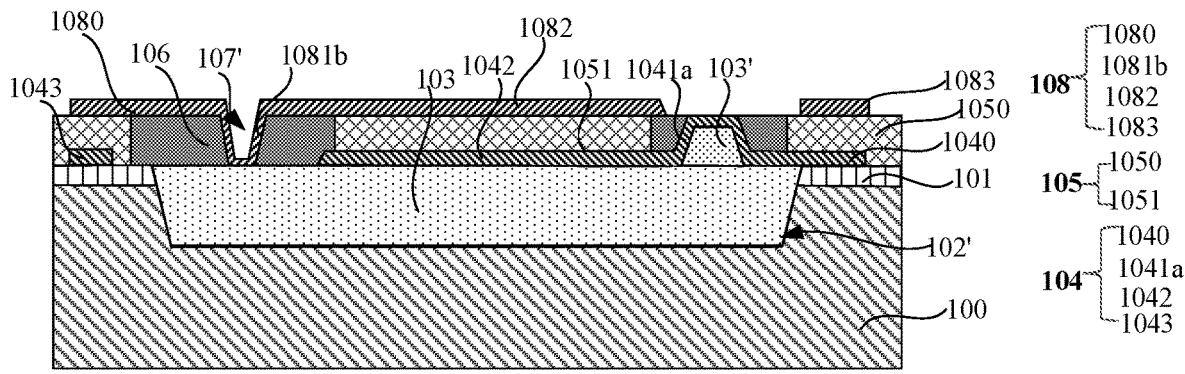

Referring to FIG. 15B, in S56, a top electrode layer 108 may be formed on the piezoelectric layer 1051 and a portion of the second sacrificial layer 106 around the piezoelectric layer 1051. A portion of the top electrode layer 108 covering the second groove 107' may be the top electrode concave portion. The details may refer to corresponding descriptions in S26.

Figure 15C:
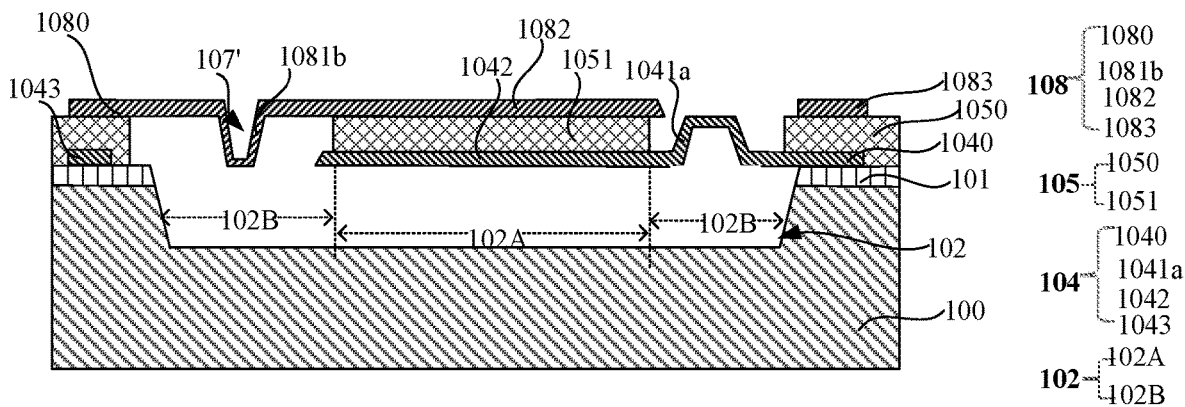

Referring to FIG. 15C, in S57, the second sacrificial layer 106 and the first sacrificial layer 103 having the first sacrificial protrusion 103' may be removed, thereby emptying the third groove again to form the cavity 102. The cavity 102 may include the space of the third groove 102' increased by the bottom electrode convex portion 1041a, the space increased by the top electrode concave portion 1081b, and the space originally occupied by the second sacrificial layer 106 under the top electrode concave portion 1081b. Removing the second sacrificial layer 106 and the first sacrificial layer 103 having the first sacrificial protrusion 103' may refer to corresponding descriptions in forgoing embodiments.

In the bulk acoustic wave resonator formed by the fabrication method in the foregoing embodiments, the bottom electrode layer 104 may include the bottom electrode convex portion 1041a, and the top electrode layer 108 may include the top electrode concave portion 1081b.

Exemplary Embodiment 7

The present disclosure also provides a fabrication method of the bulk acoustic wave resonator (e.g., the bulk acoustic wave resonator illustrated in FIG. 8). The method may include following.

S61: providing a substrate, and forming a first sacrificial layer on a portion of the substrate.

S62: forming a first sacrificial protrusion on an edge portion of the first sacrificial layer.

S63: forming a bottom electrode layer over the first sacrificial layer, where the portion of the bottom electrode layer covering the surface of the first sacrificial protrusion may form the bottom electrode convex portion.

S64: forming a piezoelectric layer over the bottom electrode layer, where the bottom electrode convex portion may be extended surrounding the peripheral direction of the piezoelectric layer and may be exposed by the piezoelectric layer.

S65: forming a second sacrificial layer in the exposed region around the piezoelectric layer, where the top surface of the second sacrificial layer may be coplanar with the top surface of the piezoelectric layer.

S66: forming a top electrode layer on the piezoelectric layer and a portion of the second sacrificial layer around the piezoelectric layer, where the top electrode layer may be extended flat on the piezoelectric layer and the second sacrificial layer.

S67: removing the second sacrificial layer and the first sacrificial layer having the first sacrificial protrusion, to form a cavity in the positions of the second sacrificial layer and the first sacrificial layer. The bottom electrode convex portion may be located in the cavity region on the periphery of the piezoelectric layer, and a portion of the top electrode layer over the cavity may be extended flat.

The steps S61-S64 in embodiment 7 may be basically the same as the steps S41-S44 in embodiment 5, and details may refer to corresponding descriptions associated with FIGS. 14A-14C.

Figure 16A:
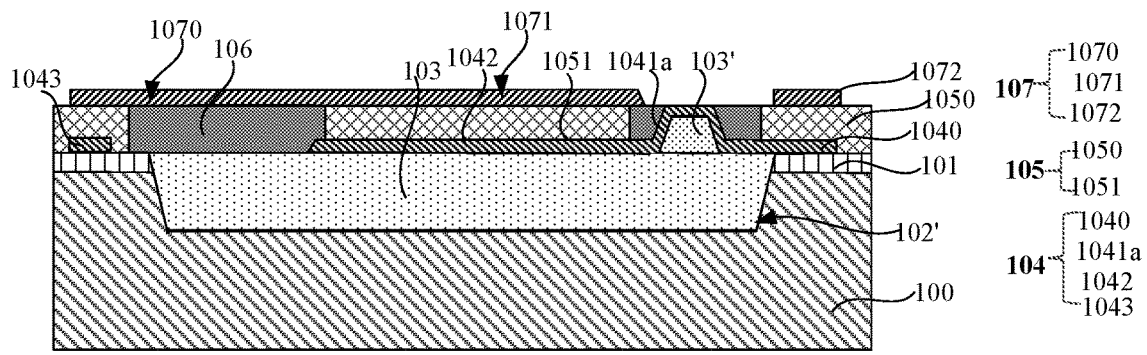
FIGS. 16A-16B illustrate cross-sectional views along a XX' direction in FIG. 1A of semiconductor structures corresponding to certain stages of another exemplary fabrication method of a bulk acoustic wave resonator consistent with various disclosed embodiments of the present disclosure.

Referring to FIG. 16A, in S65 and S66, the second sacrificial layer 106 may be formed, and the second sacrificial layer 106 may fully fill the gap between the piezoelectric peripheral portion 1050 and the piezoelectric layer 1051. The top surfaces of the piezoelectric peripheral portion 1050, the piezoelectric layer 1051, and the second sacrificial layer 106 may be flush. A top electrode layer 107 may be formed on the piezoelectric layer and a portion of the second sacrificial layer around the piezoelectric layer. The top electrode layer may be extended flat on the piezoelectric layer and the second sacrificial layer. Details may refer to corresponding descriptions in S35-S36.

Figure 16B:
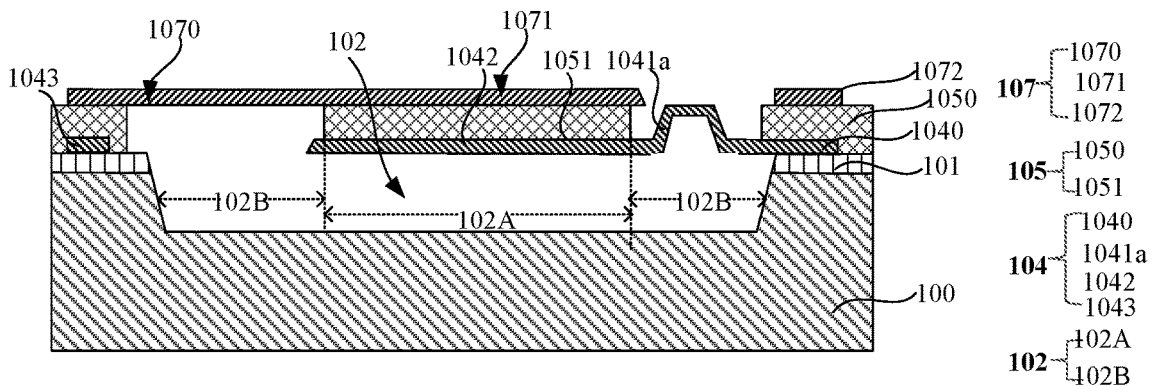

Referring to FIG. 16B, in S67, the second sacrificial layer 106 and the first sacrificial layer 103 having the first sacrificial protrusion may be removed, to form the cavity 102 in the positions of the second sacrificial layer 106 and the first sacrificial layer 103. The bottom electrode convex portion 1041a may be located in the cavity region on the periphery of the piezoelectric layer 1051, and the portion of the top electrode layer 107 over the cavity may be extended flat.

In the bulk acoustic wave resonator formed by the fabrication method in the foregoing embodiments, the bottom electrode layer 104 may include the bottom electrode convex portion 1041a, and the portion of the top electrode layer 107 located over the cavity 102 may be extended flat.

The present disclosure also provides a fabrication method of a bulk acoustic wave resonator. The method may include providing a substrate, and forming a first sacrificial layer having a flat top surface on a portion of the substrate. The method may also include forming a bottom electrode layer on a portion of the first sacrificial layer, where a portion of the bottom electrode layer on the top surface of the first sacrificial layer may be extended flat. Moreover, the method may include forming a piezoelectric layer over the bottom electrode layer, where the piezoelectric layer may expose a portion of the first sacrificial layer and a portion of the bottom electrode layer. In addition, the method may include forming a second sacrificial layer having a protrusion or a depression in the exposed region around the piezoelectric layer, and forming a top electrode layer on the piezoelectric layer and a portion of the second sacrificial layer around the piezoelectric layer. A portion of the top electrode layer covering the protrusion or the depression of the second sacrificial layer may form the top electrode convex portion or the top electrode concave portion. Further, the method may include removing the second sacrificial layer and the first sacrificial layer, to form a cavity in the positions of the second sacrificial layer and the first sacrificial layer. The top electrode convex portion or the top electrode concave portion may be located in the cavity region on the periphery of the piezoelectric layer, and may be extended around the peripheral direction of the piezoelectric layer.

Exemplary Embodiment 8

The present disclosure also provides a fabrication method of the bulk acoustic wave resonator (e.g., the bulk acoustic wave resonator illustrated in FIG. 9). The method may include following.

S71: providing a substrate, and forming a first sacrificial layer having a flat top surface on a portion of the substrate.

S72: forming a bottom electrode layer on a portion of the first sacrificial layer, where a portion of the bottom electrode layer on the top surface of the first sacrificial layer may be extended flat.

S73: forming a piezoelectric layer over the bottom electrode layer, where the piezoelectric layer may expose a portion of the first sacrificial layer and a portion of the bottom electrode layer.

S74: forming a second sacrificial layer having a second sacrificial protrusion in the exposed region around the piezoelectric layer.

S75: forming a top electrode layer on the piezoelectric layer and a portion of the second sacrificial layer around the piezoelectric layer, where a portion of the top electrode layer covering the second sacrificial protrusion may form the top electrode convex portion.

S76: removing the second sacrificial layer having the second sacrificial protrusion and the first sacrificial layer, to form a cavity in the positions of the second sacrificial layer having the second sacrificial protrusion and the first sacrificial layer. The top electrode convex portion may be located in the cavity region on the periphery of the piezoelectric layer, and may be extended around the peripheral direction of the piezoelectric layer.

The difference between steps S71-S76 in embodiment 8 and the steps S41-S47 in embodiment 5 may include that S42 may be omitted, such that the portion of the bottom electrode layer formed on the top surface of the first sacrificial layer in S72 may be extended flat.

Figure 17A:
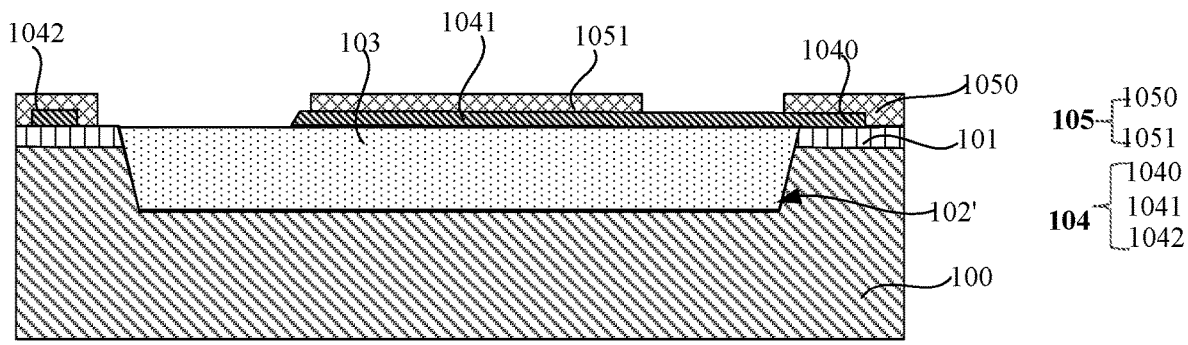
FIGS. 17A-17C illustrate cross-sectional views along a XX' direction in FIG. 1A of semiconductor structures corresponding to certain stages of another exemplary fabrication method of a bulk acoustic wave resonator consistent with various disclosed embodiments of the present disclosure.

Referring to FIG. 17A, in S71, forming the groove by etching the substrate and forming the first sacrificial layer over a portion of the substrate by filling a material in the groove may refer to the description in foregoing embodiments.

In S72, a bottom electrode material layer (not illustrated) may be formed on the surfaces of the etching protection layer 101 and the first sacrificial layer 103. Then, the bottom electrode layer 104 (i.e., the remaining bottom electrode material layer) may be formed by patterning the bottom electrode material layer. In one embodiment, the bottom electrode layer 104 may include the bottom electrode resonance portion 1041 over the subsequently formed effective working region 102A, the bottom electrode lap portion 1040, and the bottom electrode peripheral portion 1042. The bottom electrode lap portion 1040 may be extended from one side of the bottom electrode resonance portion 1041 to a portion of the etching protection layer 101 outside of the groove 102' through the surface of the first sacrificial layer 103. The bottom electrode peripheral portion 1042 may be separated from the bottom electrode resonance portion 1041. The bottom electrode peripheral portion 1042 may be connected to the side of the bottom electrode lap portion 1040 facing away from the bottom electrode resonance portion 1041, to serve as a metal contact of the to-be-formed bulk acoustic wave resonator in such region. The bottom electrode peripheral portion 1042 may be separated from the bottom electrode lap portion 1040, to serve as a portion of the bottom electrode lap portion of the adjacent bulk acoustic wave resonator. In certain embodiments, the bottom electrode peripheral portion 1042 may be omitted.

Referring to FIG. 17A, in S73, the piezoelectric layer 1051 may be formed on the bottom electrode layer 104. The piezoelectric layer 1051 may be formed on the bottom electrode resonance portion 1041, may expose a portion of the bottom electrode lap portion 1040, and may fully cover or partially cover the bottom electrode resonance portion 1041.

Figure 17B:
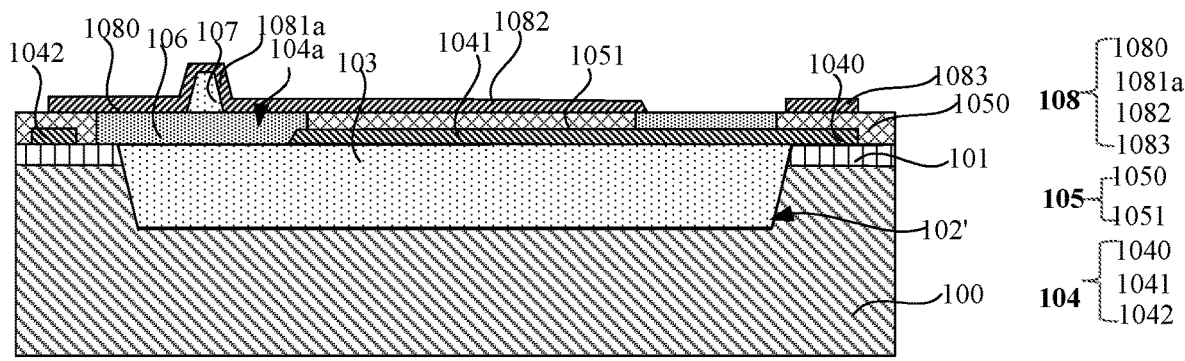

Referring to FIG. 17B, in S74-S75, the second sacrificial layer 106 and the second sacrificial protrusion 107 on the second sacrificial layer 106 may be formed over the exposed region around the piezoelectric layer 105. The top electrode layer 108 may be formed on the piezoelectric layer 1051 and a portion of the second sacrificial layer 106 around the piezoelectric layer 1051. The portion of the top electrode layer 108 covering the second sacrificial protrusion 107 may form the top electrode convex portion 1081a. Details may refer to corresponding descriptions associated with S15-S16.

Figure 17C:
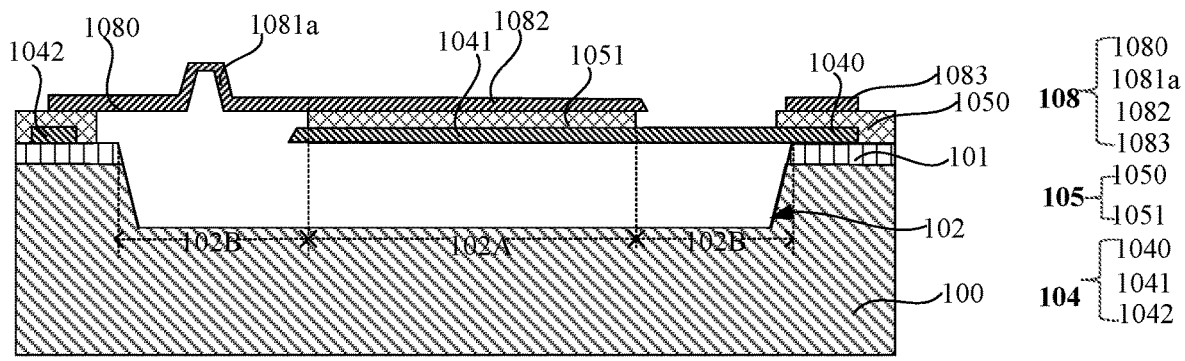

Referring to FIG. 17C, in S76, the second sacrificial protrusion 107, the second sacrificial layer 106 and the first sacrificial layer 103 may be removed, thereby emptying the groove again to form the cavity 102. The cavity 102 may include the space of the groove 102', the space increased by the top electrode convex portion 1081a, and the space originally occupied by the second sacrificial layer 106 under the top electrode convex portion 1081a.

In the bulk acoustic wave resonator formed by the fabrication method in the foregoing embodiments, the top electrode layer 108 may include the top electrode convex portion 1081a, and the portion of the bottom electrode layer 104 over the cavity 102 may be extended flat.

Exemplary Embodiment 9

The present disclosure also provides a fabrication method of the bulk acoustic wave resonator (e.g., the bulk acoustic wave resonator illustrated in FIG. 10). The method may include following.

S81: providing a substrate, and forming a first sacrificial layer having a flat top surface on a portion of the substrate.

S82: forming a bottom electrode layer on a portion of the first sacrificial layer, where a portion of the bottom electrode layer on the top surface of the first sacrificial layer may be extended flat.

S83: forming a piezoelectric layer over the bottom electrode layer, where the piezoelectric layer may expose a portion of the first sacrificial layer and a portion of the bottom electrode layer.

S84: forming a second sacrificial layer having a first groove in the exposed region around the piezoelectric layer.

S85: forming a top electrode layer on the piezoelectric layer and a portion of the second sacrificial layer around the piezoelectric layer, where a portion of the top electrode layer covering the first groove may form the top electrode concave portion.

S86: removing the second sacrificial layer having the first groove and the first sacrificial layer, to form a cavity in the positions of the second sacrificial layer having the first groove and the first sacrificial layer. The top electrode concave portion may be located in the cavity region on the periphery of the piezoelectric layer, and may be extended around the peripheral direction of the piezoelectric layer.

The steps S81-S83 in embodiment 9 may be basically the same as the steps S71-S73 in embodiment 8.

Figure 18A:
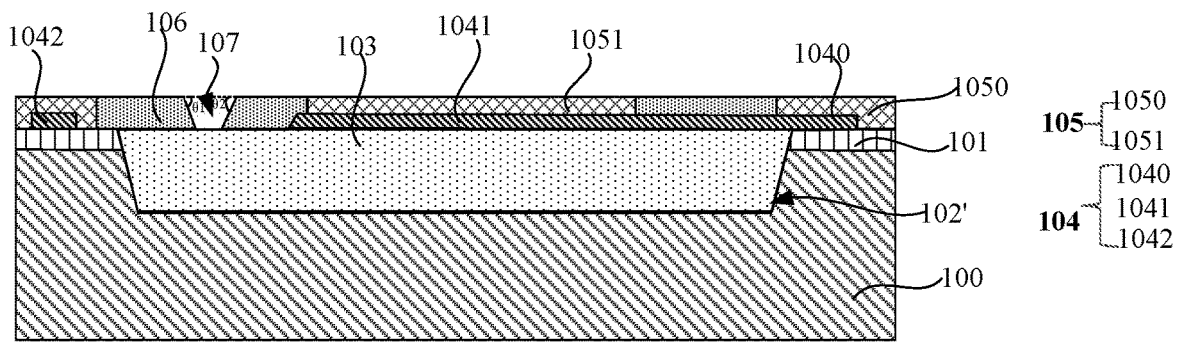
FIGS. 18A-18C illustrate cross-sectional views along a XX' direction in FIG. 1A of semiconductor structures corresponding to certain stages of another exemplary fabrication method of a bulk acoustic wave resonator consistent with various disclosed embodiments of the present disclosure.

Referring to FIG. 18A, in S84, the second sacrificial layer may be formed, and the second sacrificial layer 106 may fully fill the gap between the piezoelectric peripheral portion 1050 and the piezoelectric layer 1051. Then, the second sacrificial layer 106 may be patterned through a photolithography process or combined photolithography and etching processes, to form the first groove 107. Details may refer to corresponding descriptions associated with S25.

Figure 18B:
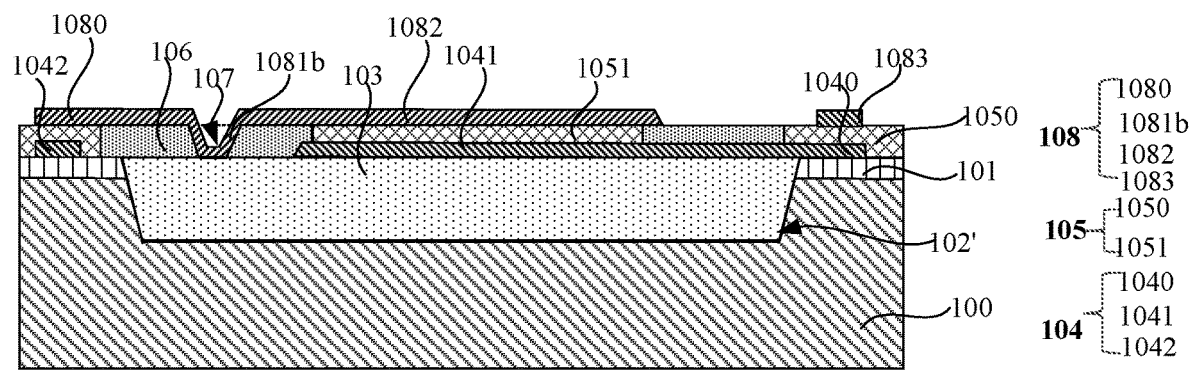

Referring to FIG. 18B, in S85, the top electrode layer 108 may be formed on the piezoelectric layer 1051, and a portion of the second sacrificial layer 106 around the piezoelectric layer 1051. The portion of the top electrode layer 108 covering the first groove 107 may form the top electrode concave portion. Details may refer to corresponding descriptions associated with S26.

Figure 18C:
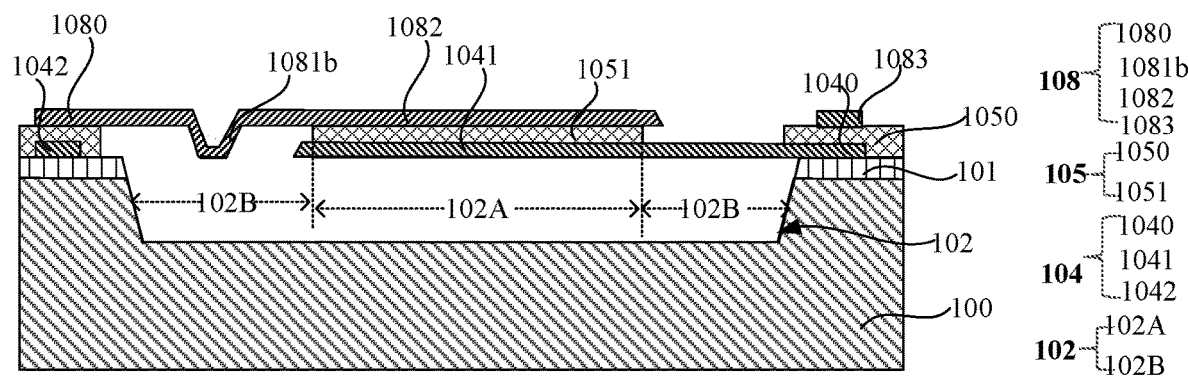

Referring to FIG. 18C, in S86, the second sacrificial layer 106 and the first sacrificial layer 103 may be removed, thereby emptying the third groove again to form the cavity 102. The cavity 102 may include the space of the third groove 102', and the space originally occupied by the second sacrificial layer 106 under the top electrode concave portion 1081b.

In the bulk acoustic wave resonator formed by the fabrication method in the foregoing embodiments, the top electrode layer 108 may include the top electrode concave portion 1081b, and the portion of the bottom electrode layer 104 over the cavity 102 may be extended flat.

It should be noted that in certain embodiments, in steps S11, S21, S31, S41, S51, S61, S71, or S81, the first sacrificial layer 103 protruded on the substrate may be formed by film deposition combined with photolithography and etching processes, such that the subsequently formed cavity may have a cavity structure overall protruded on the surface of the substrate, which may not be repeated herein. Therefore, the corresponding sidewalls of the formed bottom electrode peripheral portion 1043, the bottom electrode lap portion 1040, the piezoelectric peripheral portion 1050, the top electrode peripheral portion 1083, and the top electrode lap portion 1080 may need to be deformed to adapt to the protruded first sacrificial layer 103, and the longitudinal cross-section thereof may have a "Z"-character shaped structure.

When electric energy is applied between the bottom electrode and the top electrode, due to the piezoelectric phenomenon generated in the piezoelectric layer, desired longitudinal waves propagating along a thickness direction of the piezoelectric layer and undesired transverse waves propagating along the plane of the piezoelectric layer may be generated. The transverse waves may be blocked by the electrode concave portion and/or electrode convex portion suspended over the cavity on the periphery of the piezoelectric layer, and may be reflected back to the region corresponding to the piezoelectric layer, thereby reducing the loss caused by the transverse waves when being propagated to the periphery of the cavity, improving the acoustic loss, improving the quality factor of the resonator, and ultimately improving the device performance. The periphery of the piezoelectric layer and the periphery of the cavity may be separated from each other. In other words, the piezoelectric layer may not be continuously extended over the substrate on the periphery of the cavity, and may fully limit the effective working region of the bulk acoustic wave resonator in the cavity region. Further, both the bottom electrode lap portion and the top electrode lap portion may be merely extended to a portion of the edge of the cavity (in other words, the bottom electrode layer and the top electrode layer may not fully cover the cavity), which may reduce the influence of the film layer around the cavity on the longitudinal vibration generated by the piezoelectric layer, and may improve the device performance.

The present disclosure also provides a filter including at least one bulk acoustic wave resonator in any one of the disclosed embodiments.

The present disclosure also provides a radio frequency communication system including at least one filter in any one of the disclosed embodiments.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A bulk acoustic wave resonator, comprising:
a substrate;
a bottom electrode layer, disposed over the substrate, wherein a cavity is formed between the bottom electrode layer and the substrate; and
a piezoelectric layer, formed on the bottom electrode layer and over the cavity;
a top electrode layer, formed over the piezoelectric layer, wherein:
each of the bottom electrode layer and the top electrode layer has a convex portion or concave portion, wherein the convex portion is located in a region of the cavity and is protruded facing away from a bottom of the cavity, the concave portion is located in the region of the cavity and is recessed towards the bottom of the cavity, and each of the convex portion and the concave portion is located in a peripheral region surrounding the piezoelectric layer.

2. The bulk acoustic wave resonator according to claim 1, wherein:
the bottom electrode layer further includes a bottom electrode lap portion, wherein one end of the bottom electrode lap portion is connected to a bottom electrode concave portion or a bottom electrode convex portion, and another end of the bottom electrode lap portion is connected to the substrate at a periphery of the cavity;
the top electrode layer further includes a top electrode lap portion, wherein one end of the top electrode lap portion is connected to a top electrode convex portion or a top electrode concave portion, and another end of the top electrode lap portion is extended to be suspended over the substrate at the periphery of the cavity;
the bottom electrode lap portion and the top electrode lap portion are staggered from each other; and
the bottom electrode layer further includes a bottom electrode resonance portion that overlaps the piezoelectric layer, and the top electrode layer further includes a top electrode resonance portion that overlaps the piezoelectric layer, wherein each of the bottom electrode resonance portion and the top electrode resonance portion has a polygon shape.

3. The bulk acoustic wave resonator according to claim 2, wherein:
the bottom electrode concave portion or the bottom electrode convex portion is disposed along an edge of the bottom electrode resonance portion, and is disposed at least in a region where the bottom electrode lap portion and the bottom electrode resonance portion are aligned; and
the top electrode convex portion or the top electrode concave portion is disposed along an edge of the top electrode resonance portion, and is disposed at least in a region where the top electrode lap portion and the top electrode resonance portion are aligned.

4. The bulk acoustic wave resonator according to claim 3, wherein:
the bottom electrode concave portion or the bottom electrode convex portion is at least staggered from the top electrode lap portion over the cavity, or
the bottom electrode concave portion or the bottom electrode convex portion fully surrounds the bottom electrode resonance portion; and
the top electrode convex portion or the top electrode concave portion is at least staggered from the bottom electrode lap portion over the cavity, or
the top electrode convex portion or the top electrode concave portion fully surrounds the top electrode resonance portion.

5. The bulk acoustic wave resonator according to claim 3, wherein:
projections of the top electrode convex portion or the top electrode concave portion and the bottom electrode concave portion or the bottom electrode convex portion on the bottom of the cavity are just connected with, staggered from, or overlapped with, each other.

6. The bulk acoustic wave resonator according to claim 3, wherein:
the bottom electrode concave portion or the bottom electrode convex portion, the bottom electrode lap portion and the bottom electrode resonance portion are formed using a same film layer; and
the top electrode convex portion or the top electrode concave portion, the top electrode lap portion and the top electrode resonance portion are formed using a same film layer.

7. The bulk acoustic wave resonator according to claim 4, wherein:
a portion of the bottom electrode lap portion over the cavity fully covers the cavity, and does not overlap the top electrode lap portion in a width direction of the top electrode lap portion.

8. The bulk acoustic wave resonator according to claim 1, wherein:
a sidewall of a top electrode convex portion or a top electrode concave portion is inclined with respect to a top surface of the piezoelectric layer; and
a sidewall of a bottom electrode concave portion or a bottom electrode convex portion is inclined with respect to a bottom surface of the piezoelectric layer.

9. The bulk acoustic wave resonator according to claim 8, wherein:
an angle between the sidewall of the top electrode convex portion or the top electrode concave portion and the top surface of the piezoelectric layer is less than or equal to 45°, and
an angle between the sidewall of the bottom electrode concave portion or the bottom electrode convex portion and the bottom surface of the piezoelectric layer is less than or equal to 45°.

10. The bulk acoustic wave resonator according to claim 1, wherein:
the cavity has a groove structure having an entirety of the bottom recessed into the substrate, or
the cavity has a cavity structure overall protruded on the substrate.

11. The bulk acoustic wave resonator according to claim 1, wherein:
a line width of a top electrode convex portion or a top electrode concave portion is a minimum line width allowed by a process for forming the top electrode convex portion or the top electrode concave portion, and
a line width of a bottom electrode concave portion or a bottom electrode convex portion is a minimum line width allowed by a process for forming the bottom electrode concave portion or the bottom electrode convex portion.

12. The bulk acoustic wave resonator according to claim 1, wherein:

a horizontal distance between a top electrode convex portion or a top electrode concave portion and the piezoelectric layer is a minimum distance allowed by a process for forming the top electrode convex portion or the top electrode concave portion, and a horizontal distance between a bottom electrode concave portion or a bottom electrode convex portion and the piezoelectric layer is a minimum distance allowed by a process for forming the bottom electrode concave portion or the bottom electrode convex portion.

13. The bulk acoustic wave resonator according to claim 1, wherein:
a portion of one of the top electrode layer and the bottom electrode layer over the cavity is extended flat.

14. The bulk acoustic wave resonator according to claim 1, wherein:
the bottom electrode layer has the convex portion, and the top electrode layer has the concave portion; or
the bottom electrode layer has the convex portion, and the top electrode layer has the convex portion; or
the bottom electrode layer has the concave portion, and the top electrode layer has the convex portion; or
the bottom electrode layer has the concave portion, and the top electrode layer has the concave portion.

15. A filter, comprising:
a bulk acoustic wave resonator, the bulk acoustic wave resonator including:
a substrate;
a bottom electrode layer, disposed over the substrate, wherein a cavity is formed between the bottom electrode layer and the substrate;
a piezoelectric layer, formed on the bottom electrode layer and over the cavity; and
a top electrode layer, formed over the piezoelectric layer, wherein:
each of the bottom electrode layer and the top electrode layer has a convex portion or concave portion, wherein the convex portion is located in a region of the cavity and is protruded facing away from a bottom of the cavity, the concave portion is located in the region of the cavity and is recessed towards the bottom of the cavity, and each of the convex portion and the concave portion is located in a peripheral region surrounding the piezoelectric layer.

16. The filter according to claim 15, wherein:
a portion of one of the top electrode layer and the bottom electrode layer over the cavity is extended flat.

17. The filter according to claim 15, wherein:
the bottom electrode layer has the convex portion, and the top electrode layer has the concave portion; or
the bottom electrode layer has the convex portion, and the top electrode layer has the convex portion; or
the bottom electrode layer has the concave portion, and the top electrode layer has the convex portion; or
the bottom electrode layer has the concave portion, and the top electrode layer has the concave portion.

18. A radio frequency communication system, comprising:
a filter including a bulk acoustic wave resonator, the bulk acoustic wave resonator including:
a substrate;
a bottom electrode layer, disposed over the substrate, wherein a cavity is formed between the bottom electrode layer and the substrate;
a piezoelectric layer, formed on the bottom electrode layer and over the cavity; and
a top electrode layer, formed over the piezoelectric layer, wherein:
each of the bottom electrode layer and the top electrode layer has a convex portion or concave portion, wherein the convex portion is located in a region of the cavity and is protruded facing away from a bottom of the cavity, the concave portion is located in the region of the cavity and is recessed towards the bottom of the cavity, and each of the convex portion and the concave portion is located in a peripheral region surrounding the piezoelectric layer.

19. The radio frequency communication system according to claim 18, wherein:
a portion of one of the top electrode layer and the bottom electrode layer over the cavity is extended flat.

20. The radio frequency communication system according to claim 18, wherein:
the bottom electrode layer has the convex portion, and the top electrode layer has the concave portion; or
the bottom electrode layer has the convex portion, and the top electrode layer has the convex portion; or
the bottom electrode layer has the concave portion, and the top electrode layer has the convex portion; or
the bottom electrode layer has the concave portion, and the top electrode layer has the concave portion.

* * * * *